US012811607B2

(12) United States Patent
Qu et al.

(10) Patent No.: US 12,811,607 B2
(45) Date of Patent: Nov. 24, 2026

(54) CHANNEL CODING METHOD AND APPARATUS

(71) Applicant: Huawei Technologies Co., Ltd., Shenzhen (CN)

(72) Inventors: Weilin Qu, Beijing (CN); Yiling Wu, Beijing (CN); Yujian Tang, Chengdu (CN); Zhe Jin, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 85 days.

(21) Appl. No.: 19/017,023

(22) Filed: Jan. 10, 2025

(65) Prior Publication Data

US 2025/0150097 A1 May 8, 2025

Related U.S. Application Data

(63) Continuation of application No. PCT/CN2023/104446, filed on Jun. 30, 2023.

(30) Foreign Application Priority Data

Jul. 13, 2022 (CN) ........................ 202210822018.4

(51) Int. Cl.
*H03M 13/23* (2006.01)
*H03M 13/00* (2006.01)
*H03M 13/09* (2006.01)
*H03M 13/27* (2006.01)
*H03M 13/29* (2006.01)
*H03M 13/39* (2006.01)
*H04L 1/00* (2006.01)

(52) U.S. Cl.
CPC ..... *H03M 13/235* (2013.01); *H03M 13/2707* (2013.01); *H03M 13/2933* (2013.01);
(Continued)

(58) Field of Classification Search
CPC ........... H03M 13/235; H03M 13/2707; H03M 13/2933; H03M 13/3938; H03M 13/6362;
(Continued)

(56) References Cited

U.S. PATENT DOCUMENTS 7,089,480 B2 * 8/2006 Yun .................. H03M 13/6368 714/790
12,119,933 B2 * 10/2024 Liu .................... H03M 13/036
(Continued)

FOREIGN PATENT DOCUMENTS

CN 108737020 A 11/2018
EP 3179655 A1 6/2017
WO 2021044765 A1 3/2021

OTHER PUBLICATIONS

Omar et al., On the Tail-Biting Convolutional Code Decoder for the LTE and LTE-A Standards', 2013, IEEE, pp. 510-514. (Year: 2013).*

(Continued)

*Primary Examiner* — John J Tabone, Jr.
(74) *Attorney, Agent, or Firm* — Slater Matsil, LLP

(57) ABSTRACT

This application provides a channel coding method and apparatus, including: A terminal device generates a first bit sequence, and determines a second bit sequence based on the first bit sequence, where the second bit sequence includes M bits, any bit in the last N bits in the second bit sequence has a same value as a bit that is in the first N bits in the first bit sequence and that is in one-to-one correspondence with the bit, M and N are positive integers, and M is greater than N; performs convolutional coding on the second bit sequence based on a convolutional encoder, to obtain a third bit sequence, where an initial value of a shift register of the convolutional encoder is equal to values of the last N bits in the second bit sequence, and the convolutional encoder includes N shift registers; and sends the third bit sequence.

20 Claims, 5 Drawing Sheets

400

(52) U.S. Cl.
CPC ... *H03M 13/3938* (2013.01); *H03M 13/6362* (2013.01); *H04L 1/0033* (2013.01); *H04L 1/0041* (2013.01); *H04L 1/0045* (2013.01); *H04L 1/0057* (2013.01); *H04L 1/0059* (2013.01); *H04L 1/0061* (2013.01); *H04L 1/0067* (2013.01); *H04L 1/0071* (2013.01); *H03M 13/09* (2013.01); *H03M 13/2778* (2013.01); *H03M 13/2792* (2013.01); *H03M 13/6502* (2013.01)

(58) Field of Classification Search
CPC ............ H03M 13/09; H03M 13/2778; H03M 13/2792; H03M 13/6502; H04L 1/0033; H04L 1/0041; H04L 1/0045; H04L 1/0057; H04L 1/0059; H04L 1/0061; H04L 1/0067; H04L 1/0071
USPC .................................................. 714/752, 786
See application file for complete search history.

(56) References Cited

U.S. PATENT DOCUMENTS

2011/0271169 A1* 11/2011 Pi ...................... H03M 13/6544 714/E11.032
2016/0112157 A1* 4/2016 Li ....................... G06F 11/1004 714/807
2019/0260507 A1 8/2019 Lin et al.
2019/0305887 A1* 10/2019 Jang ...................... H04L 1/0061
2020/0021389 A1* 1/2020 Guan .................. H04B 7/0696
2020/0322083 A1* 10/2020 Jang .................. H03M 13/6362
2025/0150097 A1* 5/2025 Qu ........................ H04L 1/0041

OTHER PUBLICATIONS

Zhang Min et al:"Research on An-Based Decode of Tail-Biting Convolutional Codes and Their Performance Analyses Used in LTE System",May 15, 2009,XP031525040,ISBN: 978-0-7695-3600-2,total 4 pages.
Felipe A. P. de Figueiredo et al.,"LTE-Advanced channel coding generic procedures A high-level model to guide low-level implementations",Apr. 17, 2013,XP032441155, DOI:10.1109/WTS.2013.6566238,ISBN: 978-1-4673-5011-2,total 7 pages.
3GPP TSG RAN1 #49bis, R1-072670, Convolutional code rate matching in LTE, Motorola,Jun. 25-29,2007, XP050106366,total 7 pages.
3GPP TS 36.212 V17.1.0 (Mar. 2022), "3rd Generation Partnership Project; Technical Specification Group Radio Access Network; Evolved Universal Terrestrial Radio Access (E-UTRA); Multiplexing and channel coding (Release 17)", total 257 pages.

* cited by examiner

CHANNEL CODING METHOD AND APPARATUS

CROSS-REFERENCE TO RELATED APPLICATIONS

This application is a continuation of International Application No. PCT/CN2023/104446, filed on Jun. 30, 2023, which claims priority to Chinese Patent Application No. 202210822018.4, filed on Jul. 13, 2022. The disclosures of the aforementioned applications are hereby incorporated by reference in their entireties.

TECHNICAL FIELD

This application relates to the communication field, and more specifically, to a channel coding method and apparatus.

BACKGROUND

With increasingly widespread application of 5th generation new radio (5G NR) machine-type communication (MTC) and internet of things (IoT) communication, a quantity of connections of IoT devices increases daily, and the industry has an increasingly strong demand to reduce costs and power consumption of the IoT devices. Therefore, passive internet of things (Passive IoT) or backscatter communication (Backscatter) is the research direction. However, due to limitations of power consumption and complexity of a passive internet of things terminal device/back communication terminal device, power consumption of such terminals may be limited to target power consumption less than 1 microwatt (μW) or less than 100 μW. Under this target, it is difficult for the passive internet of things terminal device to implement complex channel coding. For example, it is difficult for the passive internet of things terminal device to implement a complex operation or store a large amount of information in a memory. Therefore, simple channel coding needs to be implemented to improve coverage of the passive internet of things terminal device.

In a current long term evolution (LTE) system, to ensure channel coding performance, there are usually the following two channel coding methods: (1) Channel coding can be started only after a cyclic redundancy check (CRC) is added to information bits. (2) A rate matching operation is performed after coding. Rate matching includes block interleaving, bit collection, bit selection, and the like. However, for the passive internet of things terminal device, due to an energy consumption limitation, it is usually difficult to start channel coding after CRC attachment, or perform a rate matching operation after coding. However, if no rate matching operation is performed after coding, channel coding performance is poor.

Therefore, a channel coding method is urgently required, to not only reduce power consumption and complexity of convolutional coding, but also ensure performance of convolutional coding.

SUMMARY

This application provides a channel coding method and apparatus, to help ensure performance of convolutional coding when reducing complexity of convolutional coding.

According to a first aspect, a channel coding method is provided, including: A terminal device generates a first bit sequence. The first bit sequence is an original bit sequence. The terminal device determines a second bit sequence based on the first bit sequence. The second bit sequence is a to-be-encoded bit sequence, the second bit sequence includes M bits, the last N bits in the second bit sequence are in one-to-one correspondence with the first N bits in the first bit sequence, and any bit in the last N bits in the second bit sequence has a same value as a bit that is in the first N bits in the first bit sequence and that is in one-to-one correspondence with the bit. M and N are positive integers, and M is greater than N. The terminal device performs convolutional coding on the second bit sequence based on a convolutional encoder, to obtain a third bit sequence. The third bit sequence is an encoded bit sequence, an initial value of a shift register of the convolutional encoder is equal to values of the last N bits in the second bit sequence, and the convolutional encoder includes N shift registers. The terminal device sends the third bit sequence.

The first bit sequence is an original bit sequence. Optionally, the first bit sequence may be generated by another chip or device. The terminal device described above only processes the first bit sequence, to finally obtain the third bit sequence.

According to the technical solution of this application, the convolutional encoder is enabled for coding without obtaining the complete first bit sequence after CRC bits are added to original information bits. This effectively reduces buffer/storage overheads used for convolutional coding in a low-power terminal device, and helps further reduce power consumption used for convolutional coding in the low-power terminal device. In addition, convolutional coding has a feature that an end state of a register is consistent with an initial state of the register, to ensure performance of convolutional coding performed by the low-power terminal device, and effectively improve coverage performance of communication between the low-power terminal device and the network device.

With reference to the first aspect, in some implementations of the first aspect, the first M−N bits in the second bit sequence are the $(N+1)^{th}$ to the $M^{th}$ bits in the first bit sequence. In this way, a bit sequence other than the first N bits in the original bit sequence is not disturbed, and complexity of convolutional coding performed by the low-power terminal device is not additionally increased.

With reference to the first aspect, in some implementations of the first aspect, the initial value of the shift register of the convolutional encoder includes values of the N shift registers, a value of the $i^{th}$ shift register is $s_i$, i is a natural number less than N, and the values of the last N bits in the second bit sequence are $x_{M-N+i}$. Values of the first N bits in the first bit sequence are $c_i$. $s_i$ is equal to $c_i$, and $x_{M-N+i}$ is equal to $c_{N-1-i}$; or $s_i$ is equal to $c_{N-1-i}$, and $x_{M-N+i}$ is equal to $c_i$. In this way, the first N bits in the first bit sequence are moved to the tail of the second bit sequence for sending, and are arranged in ascending or descending order of sequence numbers. Convolutional coding has a feature that an end state of a register is consistent with an initial state of the register, to ensure performance of convolutional coding performed by the low-power terminal device, and effectively improve coverage performance of communication between the low-power terminal device and the network device.

With reference to the first aspect, in some implementations of the first aspect, N is equal to 6.

With reference to the first aspect, in some implementations of the first aspect, that the terminal device sends the third bit sequence includes: The terminal device skips performing first processing on the third bit sequence, and sends the third bit sequence. The first processing includes block interleaving and/or rate matching, and the rate matching includes at least one of bit collection, bit selection, and bit pruning. In this way, the third bit sequence is sent without any processing, so that buffer/storage overheads used for convolutional coding in the low-power terminal device are effectively reduced, and power consumption used for convolutional coding in the low-power terminal device is not additionally increased.

With reference to the first aspect, in some other implementations of the first aspect, that the terminal device sends the third bit sequence includes: The terminal device performs second processing on the third bit sequence, to obtain a processed third bit sequence. The second processing includes performing block interleaving using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16. The terminal device sends the processed third bit sequence. The block interleaving may also be referred to as sub-block interleaving. In this way, the third bit sequence is processed to some extent before being sent, so that buffer/storage overheads used for convolutional coding in the low-power terminal device are slightly increased, to help improve performance of convolutional coding and effectively improve coverage performance of communication between the low-power terminal device and the network device.

With reference to the first aspect, in some implementations of the first aspect, the terminal device sends first information. The first information indicates that the terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder. In this way, the network device can obtain a channel coding capability associated with a type of the terminal device, and correspondingly decode, for different channel coding schemes of different types of terminal devices, information bits sent by the terminal devices, so that both terminal devices with different capabilities and the network device can effectively complete channel coding sending and receiving, to effectively improve coverage performance of communication between the different terminal devices and the network device.

According to a second aspect, a channel coding method is provided, including: The network device receives a third bit sequence. The third bit sequence is a to-be-decoded bit sequence. The network device determines the last N bits in a second bit sequence based on the third bit sequence, and the network device decodes the third bit sequence based on the last N bits in the second bit sequence, to obtain the second bit sequence. The second bit sequence is a decoded bit sequence. The second bit sequence includes M bits, and the N bits are the last N bits in the second bit sequence. The network device determines a first bit sequence based on the second bit sequence. The first bit sequence is an original bit sequence. The first N bits in the first bit sequence are in one-to-one correspondence with the last N bits in the second bit sequence, and any bit in the first N bits in the first bit sequence has a same value as a bit that is in the last N bits in the second bit sequence and that is in one-to-one correspondence with the bit. M and N are positive integers, and M is greater than N.

According to the technical solution of this application, a convolutional encoder is enabled for coding without obtaining the complete first bit sequence after CRC bits are added to original information bits. This effectively reduces buffer/storage overheads used for convolutional coding in a low-power terminal device, and helps further reduce power consumption used for convolutional coding in the low-power terminal device. In addition, convolutional coding has a feature that an end state of a register is consistent with an initial state of the register, to ensure performance of convolutional coding performed by the low-power terminal device, and effectively improve coverage performance of communication between the low-power terminal device and the network device.

With reference to the second aspect, in some implementations of the second aspect, the $(N+1)^{th}$ to the $M^{th}$ bits in the first bit sequence are the first M−N bits in the second bit sequence.

With reference to the second aspect, in some implementations of the second aspect, N is equal to 6.

With reference to the second aspect, in some implementations of the second aspect, that the network device determines the last N bits in a second bit sequence based on the third bit sequence includes: The network device skips performing first processing on the third bit sequence, and obtains the last N bits in the second bit sequence based on the third bit sequence. The first processing includes block de-interleaving and/or rate de-matching, and rate matching includes at least one of bit collection, bit selection, and bit pruning.

With reference to the second aspect, in some other implementations of the second aspect, that the network device determines the last N bits in a second bit sequence based on the third bit sequence includes: The network device performs second processing on the third bit sequence, to obtain a processed third bit sequence. The second processing includes de-interleaving block interleaving performed using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16. The network device determines the last N bits in the second bit sequence based on the processed third bit sequence.

With reference to the second aspect, in some implementations of the second aspect, the method further includes: The network device receives first information. The first information indicates that a terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder.

According to a third aspect, a channel coding method is provided, including: A terminal device generates a first bit sequence. The first bit sequence is an original bit sequence, and the first bit sequence includes M bits. The terminal device determines a second bit sequence based on the first bit sequence. The second bit sequence is a to-be-encoded bit sequence. The second bit sequence includes M+N bits, N bits are predefined bits, and values of the N bits are not all equal to 0, the last N bits in the second bit sequence are predefined bits, and M and N are positive integers. The terminal device performs convolutional coding on the second bit sequence based on a convolutional encoder, to obtain a third bit sequence. The third bit sequence is an encoded bit sequence, an initial value of a shift register of the convolutional encoder is equal to values of the last N bits in the second bit sequence, and the convolutional encoder includes N shift registers. The terminal device sends the third bit sequence.

According to the technical solution of this application, the convolutional encoder is enabled for coding without obtaining the complete first bit sequence after CRC bits are added to original information bits. This effectively reduces buffer/storage overheads used for convolutional coding in a low-power terminal device, and helps further reduce power consumption used for convolutional coding in the low-power terminal device. In addition, convolutional coding has a feature that an end state of a register is consistent with an initial state of the register, to ensure performance of convolutional coding performed by the low-power terminal device, and effectively improve coverage performance of communication between the low-power terminal device and the network device.

With reference to the third aspect, in some implementations of the third aspect, the first M bits in the second bit sequence are M bits in the first bit sequence. In this way, a bit sequence in the original bit sequence is not disturbed. This helps reduce coding complexity of the terminal device when ensuring accuracy of information transmission.

With reference to the third aspect, in some implementations of the third aspect, the predefined N bits carry second information, and the second information includes information about a payload type, information about a service type, or information about a channel type. In this way, information may be carried on the predefined bits, to avoid a bit rate loss caused by additional N bits in convolutional coding during actual information transmission.

With reference to the third aspect, in some implementations of the third aspect, N is equal to 6.

With reference to the third aspect, in some implementations of the third aspect, that the terminal device sends the third bit sequence includes: The terminal device skips performing first processing on the third bit sequence, and sends the third bit sequence. The first processing includes block interleaving and/or rate matching, and the rate matching includes at least one of bit collection, bit selection, and bit pruning. In this way, the third bit sequence is sent without any processing, so that buffer/storage overheads used for convolutional coding in the low-power terminal device are effectively reduced, and power consumption used for convolutional coding in the low-power terminal device is not additionally increased.

With reference to the third aspect, in some other implementations of the third aspect, that the terminal device sends the third bit sequence includes: The terminal device performs second processing on the third bit sequence, to obtain a processed third bit sequence. The second processing includes performing block interleaving using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16. The terminal device sends the processed third bit sequence. In this way, the third bit sequence is processed to some extent before being sent, so that buffer/storage overheads used for convolutional coding in the low-power terminal device are slightly increased, to help improve performance of convolutional coding and effectively improve coverage performance of communication between the low-power terminal device and the network device.

With reference to the third aspect, in some implementations of the third aspect, the method further includes: The terminal device sends first information. The first information indicates that the terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder. In this way, the network device can obtain a channel coding capability associated with a type of the terminal device, and correspondingly decode, for different channel coding schemes of different types of terminal devices, information bits sent by the terminal devices, so that both terminal devices with different capabilities and the network device can effectively complete channel coding sending and receiving, to effectively improve coverage performance of communication between the different terminal devices and the network device.

According to a fourth aspect, a channel coding method is provided, including: The network device receives a third bit sequence. The third bit sequence is a to-be-decoded bit sequence. The network device determines the last N bits in a second bit sequence based on the third bit sequence, and decodes the third bit sequence based on the last N bits in the second bit sequence, to obtain the second bit sequence. The second bit sequence is a decoded bit sequence. The second bit sequence includes M+N bits, N bits are predefined bits, and values of the N bits are not all equal to 0, the last N bits in the second bit sequence are predefined bits, and M and N are positive integers. The network device determines a first bit sequence based on the second bit sequence. The first bit sequence is an original bit sequence, and the first bit sequence includes M bits.

According to the technical solution of this application, the convolutional encoder is enabled for coding without obtaining the complete first bit sequence after CRC bits are added to original information bits. This effectively reduces buffer/storage overheads used for convolutional coding in a low-power terminal device, and helps further reduce power consumption used for convolutional coding in the low-power terminal device. In addition, convolutional coding has a feature that an end state of a register is consistent with an initial state of the register, to ensure performance of convolutional coding performed by the low-power terminal device, and effectively improve coverage performance of communication between the low-power terminal device and the network device.

With reference to the fourth aspect, in some implementations of the fourth aspect, the first M bits in the second bit sequence are M bits in the first bit sequence.

With reference to the fourth aspect, in some implementations of the fourth aspect, the predefined N bits carry second information, and the second information includes information about a payload type, information about a service type, or information about a channel type.

With reference to the fourth aspect, in some implementations of the fourth aspect, N is equal to 6.

With reference to the fourth aspect, in some implementations of the fourth aspect, that the network device determines the last N bits in a second bit sequence based on the third bit sequence includes: The network device skips performing first processing on the third bit sequence, and obtains the N bits based on the third bit sequence. The first processing includes block de-interleaving and/or rate de-matching, and rate matching includes at least one of bit collection, bit selection, and bit pruning.

With reference to the fourth aspect, in some other implementations of the fourth aspect, that the network device determines the last N bits in a second bit sequence based on the third bit sequence includes: The network device performs second processing on the third bit sequence, to obtain a processed third bit sequence. The second processing includes de-interleaving block interleaving performed using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16. The network device determines the last N bits in the second bit sequence based on the processed third bit sequence.

With reference to the fourth aspect, in some implementations of the fourth aspect, the method further includes: The network device receives first information. The first information indicates that a terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder.

According to a fifth aspect, a channel coding apparatus is provided, including: a processing unit, configured to: generate a first bit sequence, where the first bit sequence is an original bit sequence; determine a second bit sequence based on the first bit sequence, where the second bit sequence is a to-be-encoded bit sequence, the second bit sequence includes M bits, the last N bits in the second bit sequence are in one-to-one correspondence with the first N bits in the first bit sequence, any bit in the last N bits in the second bit sequence has a same value as a bit that is in the first N bits in the first bit sequence and that is in one-to-one correspondence with the bit, M and N are positive integers, and M is greater than N; and perform convolutional coding on the second bit sequence based on a convolutional encoder, to obtain a third bit sequence, where the third bit sequence is an encoded bit sequence, an initial value of a shift register of the convolutional encoder is equal to values of the last N bits in the second bit sequence, and the convolutional encoder includes N shift registers; and a transceiver unit, configured to send the third bit sequence.

With reference to the fifth aspect, in some implementations of the fifth aspect, the first M−N bits in the second bit sequence are the $(N+1)^{th}$ to the $M^{th}$ bits in the first bit sequence.

With reference to the fifth aspect, in some implementations of the fifth aspect, the initial value of the shift register of the convolutional encoder includes values of the N shift registers, a value of the $i^{th}$ shift register is $s_i$, and i is a natural number less than N. The values of the last N bits in the second bit sequence are $x_{M-N+i}$, and values of the first N bits in the first bit sequence are $c_i$. $s_i$ is equal to $c_i$, and $x_{M-N+i}$ is equal to $c_{N-1-i}$; or $s_i$ is equal to $c_{N-1-i}$, and $x_{M-N+i}$ is equal to $c_i$.

With reference to the fifth aspect, in some implementations of the fifth aspect, N is equal to 6.

With reference to the fifth aspect, in some implementations of the fifth aspect, the processing unit is further configured to skip performing first processing on the third bit sequence. The first processing includes block interleaving and/or rate matching, and the rate matching includes at least one of bit collection, bit selection, and bit pruning. The transceiver unit is configured to send the third bit sequence.

With reference to the fifth aspect, in some other implementations of the fifth aspect, the processing unit is further configured to perform second processing on the third bit sequence, to obtain a processed third bit sequence. The second processing includes performing block interleaving using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16. The transceiver unit is further configured to send the processed third bit sequence.

With reference to the fifth aspect, in some implementations of the fifth aspect, the transceiver unit is further configured to send first information. The first information indicates that a terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder.

According to a sixth aspect, a channel coding apparatus is provided, including: a transceiver unit, configured to receive a third bit sequence, where the third bit sequence is a to-be-decoded bit sequence; and a processing unit, configured to decode the third bit sequence based on the last N bits in a second bit sequence, to obtain the second bit sequence, where the second bit sequence is a decoded bit sequence, the second bit sequence includes M bits, and the N bits are the last N bits in the second bit sequence. A network device determines a first bit sequence based on the second bit sequence, where the first bit sequence is an original bit sequence. The first N bits in the first bit sequence are in one-to-one correspondence with the last N bits in the second bit sequence, and any bit in the first N bits in the first bit sequence has a same value as a bit that is in the last N bits in the second bit sequence and that is in one-to-one correspondence with the bit. M and N are positive integers, and M is greater than N.

With reference to the sixth aspect, in some implementations of the sixth aspect, the $(N+1)^{th}$ to the $M^{th}$ bits in the first bit sequence are the first M−N bits in the second bit sequence.

With reference to the sixth aspect, in some implementations of the sixth aspect, N is equal to 6.

With reference to the sixth aspect, in some implementations of the sixth aspect, the processing unit is configured to: skip performing first processing on the third bit sequence, and obtain the last N bits in the second bit sequence based on the third bit sequence. The first processing includes block de-interleaving and/or rate de-matching, and rate matching includes at least one of bit collection, bit selection, and bit pruning.

With reference to the sixth aspect, in some other implementations of the sixth aspect, the processing unit is further configured to: perform second processing on the third bit sequence, to obtain a processed third bit sequence, where the second processing includes de-interleaving block interleaving performed using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16; and determine the last N bits in the second bit sequence based on the processed third bit sequence.

With reference to the sixth aspect, in some implementations of the sixth aspect, the transceiver unit is further configured to receive first information. The first information indicates that a terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on a convolutional encoder.

According to a seventh aspect, a channel coding apparatus is provided, including: a processing unit, configured to: generate a first bit sequence, where the first bit sequence is an original bit sequence, and the first bit sequence includes M bits; determine a second bit sequence based on the first bit sequence, where the second bit sequence is a to-be-encoded bit sequence, the second bit sequence includes M+N bits, N bits are predefined bits, values of the N bits are not all equal to 0, the last N bits in the second bit sequence are predefined bits, and M and N are positive integers; and perform convolutional coding on the second bit sequence based on a convolutional encoder, to obtain a third bit sequence, where the third bit sequence is an encoded bit sequence, an initial value of a shift register of the convolutional encoder is equal to values of the last N bits in the second bit sequence, and the convolutional encoder includes N shift registers; and a transceiver unit, configured to send the third bit sequence.

With reference to the seventh aspect, in some implementations of the seventh aspect, the first M bits in the second bit sequence are M bits in the first bit sequence.

With reference to the seventh aspect, in some implementations of the seventh aspect, the predefined N bits carry second information, and the second information includes information about a payload type, information about a service type, or information about a channel type.

With reference to the seventh aspect, in some implementations of the seventh aspect, N is equal to 6.

With reference to the seventh aspect, in some implementations of the seventh aspect, the processing unit is further configured to skip performing first processing on the third bit sequence. The first processing includes block interleaving and/or rate matching, and the rate matching includes at least one of bit collection, bit selection, and bit pruning. The transceiver unit is configured to send the third bit sequence.

With reference to the seventh aspect, in some other implementations of the seventh aspect, the processing unit is further configured to perform second processing on the third bit sequence, to obtain a processed third bit sequence. The second processing includes performing block interleaving using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16. The transceiver unit is configured to send the processed third bit sequence.

With reference to the seventh aspect, in some implementations of the seventh aspect, the transceiver unit is further configured to send first information. The first information indicates that a terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder.

According to an eighth aspect, a channel coding apparatus is provided, including: a transceiver unit, configured to receive a third bit sequence, where the third bit sequence is a to-be-decoded bit sequence; and a processing unit, configured to: determine the last N bits in a second bit sequence based on the third bit sequence, and decode the third bit sequence based on the last N bits in the second bit sequence, to obtain the second bit sequence, where the second bit sequence is a decoded bit sequence, the second bit sequence includes M+N bits, N bits are predefined bits, values of the N bits are not all equal to 0, the last N bits in the second bit sequence are predefined bits, and M and N are positive integers; and determine the first bit sequence based on the second bit sequence, where the first bit sequence is an original bit sequence, and the first bit sequence includes M bits.

With reference to the eighth aspect, in some implementations of the eighth aspect, the first M bits in the second bit sequence are M bits in the first bit sequence.

With reference to the eighth aspect, in some implementations of the eighth aspect, the predefined N bits carry second information, and the second information includes information about a payload type, information about a service type, or information about a channel type.

With reference to the eighth aspect, in some implementations of the eighth aspect, N is equal to 6.

With reference to the eighth aspect, in some implementations of the eighth aspect, the processing unit is configured to: skip performing first processing on the third bit sequence, and obtain N bits based on the third bit sequence. The first processing includes block de-interleaving and/or rate de-matching, and rate matching includes at least one of bit collection, bit selection, and bit pruning.

With reference to the eighth aspect, in some implementations of the eighth aspect, the processing unit is configured to: perform second processing on the third bit sequence, to obtain a processed third bit sequence, where the second processing includes de-interleaving block interleaving performed using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16; and determine the last N bits in the second bit sequence based on the processed third bit sequence.

With reference to the eighth aspect, in some implementations of the eighth aspect, the transceiver unit is further configured to receive first information. The first information indicates that a terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on a convolutional encoder.

According to a ninth aspect, a communication apparatus is provided, including a processor and an interface circuit. The interface circuit is configured to: receive a signal from a communication apparatus other than the communication apparatus and transmit the signal to the processor, or send a signal from the processor to a communication apparatus other than the communication apparatus. The processor is configured to implement the methods according to any one of the first aspect to the fourth aspect and the possible implementations of the first aspect to the fourth aspect by using a logic circuit or executing code instructions.

According to a tenth aspect, a computer-readable storage medium is provided. The computer-readable storage medium stores a computer program or instructions. When the computer program or the instructions are executed, the method according to any possible implementation of the first aspect to the fourth aspect is implemented.

According to an eleventh aspect, a computer program product including instructions is provided. When the instructions are run, the method according to any possible implementation of the first aspect to the fourth aspect is implemented.

According to a twelfth aspect, a computer program is provided. The computer program includes code or instructions. When the code or the instructions are run, the method according to any possible implementation of the first aspect to the fourth aspect is implemented.

According to a thirteenth aspect, a chip system is provided. The chip system includes a processor, and further includes a memory, configured to implement the method according to any possible implementation of the first aspect to the fourth aspect. The chip system includes a chip, or includes a chip and another discrete device.

According to a fourteenth aspect, a communication system is provided, including the terminal device and the network device described above.

The terminal device is configured to implement the method according to the implementations of the first aspect and the third aspect, and the network device is configured to implement the method according to the implementations of the second aspect and the fourth aspect.

In a possible design, the communication system further includes another device that interacts with the terminal device or the network device in the solution provided in embodiments of this application.

DETAILED DESCRIPTION OF ILLUSTRATIVE EMBODIMENTS

The following describes technical solutions of this application with reference to accompanying drawings.

Figure 1:
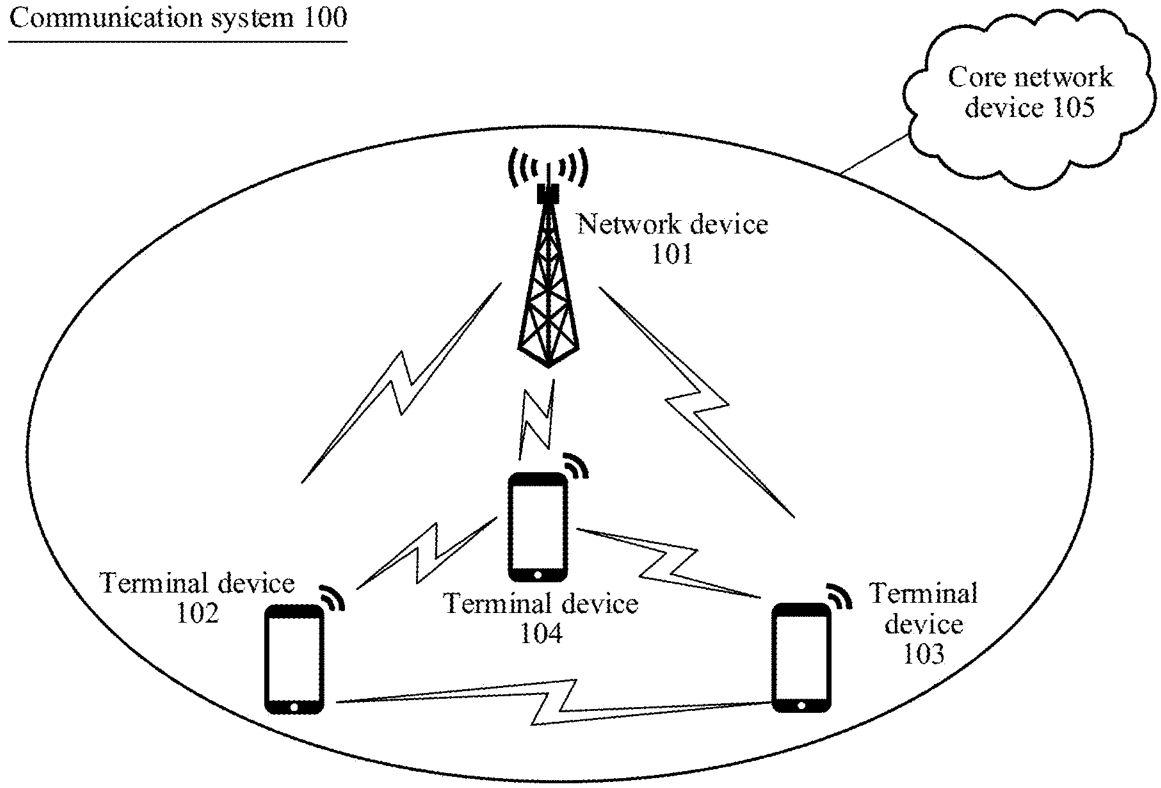
FIG. 1 is a diagram of a communication system 100 to which this application is applicable.

FIG. 1 is a diagram of a communication system 100 to which an embodiment of this application is applicable.

As shown in FIG. 1, the communication system 100 may include one or more network devices, for example, a network device 101 shown in FIG. 1. The communication system 100 may further include one or more terminal devices (which may also be referred to as user equipment (UE)), for example, a terminal device 102, a terminal device 103, and a terminal device 104 shown in FIG. 1. The communication system 100 may support a sidelink communication technology, for example, sidelink communication between the terminal device 102 and the terminal device 103, and sidelink communication between the terminal device 102 and the terminal device 104.

It should be understood that FIG. 1 is merely a diagram. The communication system may further include another network device, for example, may further include a core network device 105, and a wireless relay device and a wireless backhaul device that are not shown in FIG. 1. A quantity of network devices and a quantity of terminal devices included in the mobile communication system are not limited in embodiments of this application.

The terminal device in embodiments of this application may be a passive tag, a semi-passive tag, an active tag, a passive IoT terminal device, a semi-passive terminal device, a semi-passive IoT terminal device, an active IoT terminal device, a terminal device with a backscatter capability, an NR terminal device, an NR base station/pole station/micro base station/small cell, a reader terminal device, or the like. The terminal device may further be user equipment, an access terminal, a subscriber unit, a subscriber station, a mobile station, a remote station, a remote terminal, a mobile device, a user terminal, a wireless communication device, a user agent, or a user apparatus. The terminal in embodiments of this application may be a mobile phone, a tablet computer (pad), a computer having a wireless transceiver function, a virtual reality (VR) terminal, an augmented reality (AR) terminal, a wireless terminal in industrial control, a wireless terminal in self driving, a wireless terminal in remote medical, a wireless terminal in a smart grid, a wireless terminal in transportation safety, a wireless terminal in a smart city, a wireless terminal in a smart home, a cellular phone, a cordless phone, a session initiation protocol (SIP) phone, a wireless local loop (WLL) station, a personal digital assistant (PDA), a handheld device having a wireless communication function, a computing device or another processing device connected to a wireless modem, a vehicle-mounted device, a wearable device, a terminal in a 5G network, a terminal in a future evolved network, or the like.

The wearable device may also be referred to as a wearable smart device, and is a general term of wearable devices developed by intelligently designing daily wear by using a wearable technology, such as glasses, gloves, a watch, clothing, and shoes. The wearable device is a portable device that can be directly worn on the body or integrated into clothes or an accessory of a user. The wearable device is not only a hardware device, but also implements a powerful function through software support, data exchange, and cloud interaction. In a broad sense, intelligent wearable devices include full-featured and large-size devices that can implement complete or partial functions without depending on smartphones, for example, smart watches or smart glasses, and devices that are dedicated to only one type of application function and need to be used together with other devices such as smartphones, such as various smart bands or smart jewelry used for monitoring physical signs.

In addition, the terminal device may alternatively be a terminal device in an internet of things (IoT) system. A technical feature of the IoT is to connect an object to a network by using a communication technology, to implement an intelligent network of human-machine interconnection and object-object interconnection. A specific form of the terminal device is not limited in this application.

It should be understood that, in embodiments of this application, the terminal device may be an apparatus configured to implement a function of the terminal device, or may be an apparatus that can support the terminal device in implementing the function, for example, a chip system. The apparatus may be installed in the terminal. In this embodiment of this application, the chip system may include a chip, or may include a chip and another discrete component.

A network device in embodiments of this application may be any device with a wireless transceiver function. The device includes but is not limited to an evolved NodeB (eNB), a home NodeB (for example, a home evolved NodeB, or a home NodeB, HNB), a baseband unit (BBU), an access point (AP) in a wireless fidelity (Wi-Fi) system, a wireless relay node, a wireless backhaul node, a transmission point (TP) or a transmission and reception point (TRP), or the like, or may be a next generation NodeB (gNB) in a 5th generation (5G) such as new radio (NR) wireless communication system, a transmission point (TRP or TP), one or a group of (including a plurality of antenna panels) antenna panels of a base station in a 5G system, or a network node that forms a gNB or a transmission point, for example, a baseband unit (BBU) or a distributed unit (DU).

In some deployments, a gNB may include a central unit (CU) and a DU. The CU implements some functions of the gNB, and the DU implements some functions of the gNB. For example, the CU is responsible for processing a non-real-time protocol and service, and implements functions of a radio resource control (RRC) layer and a packet data convergence protocol (PDCP) layer. The DU is responsible for processing a physical layer protocol and a real-time service, and implements functions of a radio link control (RLC) layer, a media access control (MAC) layer, and a physical (PHY) layer. The gNB may further include an active antenna unit (AAU for short). The AAU implements some physical layer processing functions, radio frequency processing, and a function related to an active antenna. Information at the RRC layer is eventually converted into information at the PHY layer, or is converted from information at the PHY layer. Therefore, in this architecture, higher layer signaling such as RRC layer signaling may also be considered as being sent by the DU or sent by the DU and the AAU. It may be understood that the network device may be a device including one or more of a CU node, a DU node, and an AAU node. In addition, the CU may be classified into a network device in an access network (radio access network, RAN), or the CU may be classified into a network device in a core network (core network, CN). This is not limited in this application.

It should be understood that, in embodiments of this application, the network device may be an apparatus configured to implement a function of the network device, or may be an apparatus that can support the network device in implementing the function, for example, a chip system. The apparatus may be installed in the network device.

The technical solution in embodiments of this application may be applied to service scenarios such as backscatter communication in an NR communication system and passive internet of things communication, and various communication systems, for example, an LTE frequency division duplex (FDD) system, LTE time division duplex (TDD), a 5G system, vehicle-to-X (V2X) (the V2X may include vehicle to network (V2N), vehicle to vehicle (V2V), vehicle to infrastructure (V2I), vehicle to pedestrian (V2P), and the like), long term evolution-vehicle (LTE-V), an internet of vehicles, machine type communication (MTC), an internet of things (IoT), long term evolution-machine (LTE-M), machine to machine (M2M), device to device (D2D), or a future evolved communication system, for example, a 6th generation (6G) system.

In a downlink, an NR base station/cell site/micro base station/small cell, an NR terminal device, or a reader sends information to a passive terminal device/passive IoT terminal device/semi-passive terminal device/semi-passive IoT terminal device/terminal device with a backscatter capability. In an uplink, a passive terminal device/passive IoT terminal device/semi-passive terminal device/semi-passive IoT terminal device/terminal device with a backscatter capability sends information to an NR base station/cell site/micro base station/small cell, an NR terminal device, or a reader.

With increasingly widespread application of 5G NR MTC and IoT communication, a quantity of connections of IoT devices increases daily. Therefore, the industry has an increasingly strong demand to reduce costs and power consumption of the IoT devices. In the 4G era, 3GPP introduces an NB-IoT system. However, an NB-IoT terminal requires overall external power supply (for example, a battery) and has a capability of generating a high-frequency local oscillator carrier. Therefore, such terminals can achieve milliwatt-level power consumption. For a purpose of 5G IoT for connecting everything, whether such terminals are enabled without continuous external power supply to passively receive an external radio frequency signal as local power supply, or cooperate with a terminal device that is in a passive/semi-passive terminal power supply manner in another energy harvesting manner to access a 5G network and perform effective communication in the 5G network is a focus direction of current 5G research, and may also be defined as a research direction of passive internet of things or backscatter communication. In a passive internet of things system, there are terminals that can perform backscatter (Backscatter) communication, which may be defined as tags conventionally, and further classified into a passive tag and a semi-passive tag. The passive tag or a terminal device capable of passive back communication has no power supply device/circuit. The terminal device only receives a radio frequency signal sent by a network device in a downlink, obtains a direct current voltage through a series of circuits such as a filter circuit, and obtains energy supply, to enable further subsequent demodulation of a downlink signal and subsequent reflection of an uplink (modulation) signal. The network device that provides the downlink signal may be a base station device (including a series of base station devices such as a macro base station/small cell/micro base station/cell site), or may be a reader, a helper (Helper), or a series of network devices that can energize a passive/semi-passive terminal device.

Due to limitations of power consumption and complexity of a passive internet of things terminal device/back communication terminal device, power consumption of such terminals may be limited to target power consumption less than 1 μW or less than 100 μW. Under this target, it is difficult for the passive internet of things terminal device to implement complex channel coding. For example, it is difficult for the passive internet of things terminal device to implement a complex operation or store a large amount of information in a memory. Therefore, simple channel coding needs to be implemented to improve coverage of the passive internet of things terminal device.

Figure 2:
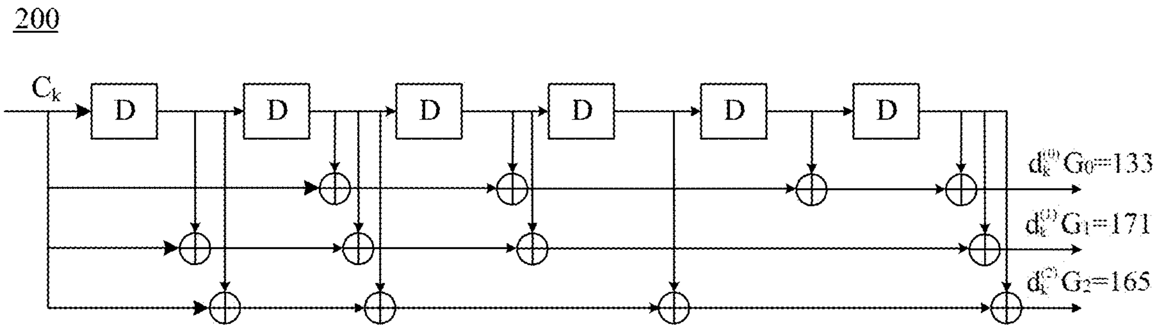
FIG. 2 is a schematic of circuits of a convolutional coding encoder in an LTE system.

FIG. 2 shows an example circuit of a convolutional coding encoder in an LTE system.

A typical communication principle of channel coding is convolutional coding (convolutional coding, CC). In an LTE system, convolutional coding is used for both a downlink control channel (PDCCH) and an NB-IoT downlink data channel (PDSCH). A constraint length of convolutional coding used in the LTE system is 7, a quantity of registers is equal to 6, and a bit rate is ⅓. That is, 1 bit is encoded into 3 bits. A coding circuit is shown in FIG. 2. Each path corresponds to a generator polynomial. That is, an exclusive OR operation is performed on several bit values in the six registers and an input bit value to obtain one encoded bit value. In addition, the LTE system uses tail biting convolutional coding (tailed biting convolutional coding, TBCC), and an initial state of a register in the TBCC is set to the last six bits in to-be-sent bits. In this way, a state of the register is returned to the last six bits in the to-be-sent bits at the end of coding, as if a snake bites its tail. Therefore, this process is referred to as tail biting convolutional coding. A quantity of input bits is defined as K, and an input bit sequence is $c_0$, $c_1$, $c_2$, . . . , $c_{K-1}$. It is defined that the initial state of the register is a register $s_i$, where i=0, 1, . . . , 5. Therefore, for tail biting convolutional coding, a value of the initial state $s_i$ is $s_i=c_{K-1-i}$. In a convolutional coding process, when a new bit is input, values of registers are shifted rightward (a value of the last register is discarded), and a value of a previous input bit is shifted rightward to the first register as a value of the first register. As defined above, the initial states of the registers are $c_{K-1}$, $c_{K-2}$, $c_{K-3}$, . . . , $c_{K-6}$. The first bit $c_0$ of an input bit sequence is input to the encoder, and output encoded bits are d $$d_o^{(0)},\ d_o^{(1)},\ \text{and}\ d_o^{(2)}.$$

When the second bit $c_1$ of the input bit sequence is input to the encoder, states of the registers are updated to $c_0$, $c_{K-1}$, $c_{K-2}$, . . . , $c_{K-5}$, and output encoded bits are $$d_1^{(0)},\ d_1^{(1)},\ \text{and}\ d_1^{(2)}.$$

Figure 3:
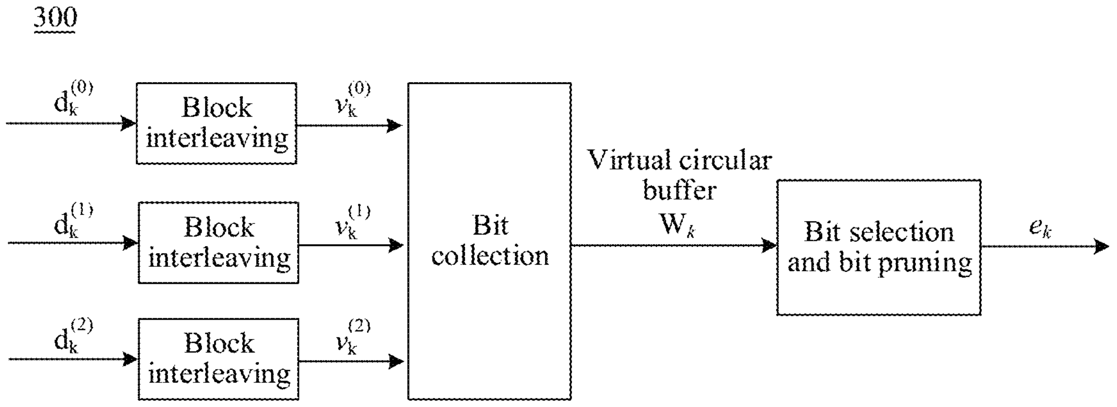
FIG. 3 is a diagram of a process of performing block interleaving and rate matching after coding.

FIG. 3 is a diagram of a process of performing block interleaving and rate matching after coding.

In convolutional coding in an existing LTE system, after three paths of output bit sequences are generated after coding through three paths of generator polynomials, block interleaving and rate matching need to be performed on the output bits. The rate matching includes bit collection, bit selection, bit pruning, and the like. First, each path of output bit sequence needs to be input to a matrix of a block interleaver for interleaving. A matrix of each block interleaver is set to R rows×C columns. C is equal to 32 by default. It is defined that a quantity of bits in an output bit sequence is D. If D is less than R×C, (R×C−D) bits are padded (Padding) before the output bit sequence, and values of the bits are null <NULL> (NULL may be simply understood as being equal to 0). In this way, the bit sequence is input to the R×C interleaver for interleaving. After the bit sequence is input to the R×C interleaver row by row, in the LTE system, column permutation needs to be performed on 32 columns of bits in the matrix of the block interleaver. The column permutation meets a column permutation pattern (Pattern) provided in Table 5.1.4-2 of the 3rd generation partnership project (3rd generation partnership project, 3GPP) protocol 36.212. The table is shown in Table 1:

TABLE 1

Column permutation pattern (Pattern)

| Quantity of columns (Number of columns) CCC subblock | Inter-column permutation pattern (Inter-column permutation pattern) <P(0), P(1), . . . , P(CCC subblock-1)> |
|---|---|
| 32 | <0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31> |

After the column permutation, R×C bits are output column by column. The foregoing block interleaving operation is performed once on each path of output bit sequence, and an output bit sequence obtained after each path of block interleaving is $$v_k^{(0)},\ v_k^{(1)}\ \text{and}\ v_k^{(2)},$$

as shown in FIG. 3. To output the interleaved bit sequences, three paths of output bits need to be collected to a memory, and bits in the output bit sequences after bit collection are defined as $$W_k.\ W_k = v_k^{(0)},\ W_{D+k} = v_k^{(1)},\ W_{2D+k} = v_k^{(2)},\ \text{and}\ k = 0, 1, \ldots, (R \times C - 1).$$

That is, all bit sequences output after three paths of block interleaving are concatenated. Then, the collected bit sequences are output to a bit selection and pruning module. A <NULL> bit padded before interleaving is pruned (which may also be referred to as a puncturing operation). Specifically, a bit in an output bit sequence obtained after bit selection is defined as $e_k$. If a quantity of output bits after bit selection is defined as E, a mathematical process of a bit selection process is as follows:

```
Set K=o and j=o
while k<E
  if w_{j mod 3RC}≠<NULL>
    e_k=w_{j mod 3RC}
    k=k+1
end
    j=j+1
end while
```

In the coding scheme shown in FIG. 3, in convolutional coding in LTE, block interleaving and rate matching operations need to be performed. Three interleavers are required for interleaving in the block interleaving, each interleaver needs to store R×C bits, and an additional matrix column permutation operation is further required in the interleavers. During bit collection, all 3×R×C bits output by the interleavers need to be stored, and bit selection of valid bits and bit pruning of <NULL> bits need to be performed. For a passive terminal device, rate matching in the LTE technology requires high memory overheads, and a passive terminal device (<1 μW) with low power consumption and low complexity cannot implement such high storage overheads and calculation implementation complexity. Even if rate matching operation is not performed after coding, the tail biting convolutional coding technology shown in FIG. 2 is still used. For tail biting convolutional coding, a complete bit sequence can be obtained only after cyclic redundancy check (CRC) bits are added to original information bits, and the last 6 bits in the bit sequence can be obtained as an initial state of a shift register in a convolutional encoder. In this case, coding can be started. Consequently, channel coding cannot be started quickly. Buffer/storage overheads of a passive terminal device with low power consumption are huge. Consequently, it is difficult for the passive terminal device with low power consumption to implement tail biting convolutional coding, block interleaving, and rate matching of LTE.

To resolve the foregoing problem, a conventional convolutional coding scheme exists in the academic field. That is, a rate matching operation does not need to be performed after convolutional coding. An initial state of a register is set to six specific state values. After 1 bit in an input bit sequence is input to three paths of generator polynomials of an encoder, 3 bits are output at the same time. It is unnecessary to collect all encoded bits from one path for interleaving. The 3 encoded bits may be sent, and then 1 bit in a next input bit sequence is input to the encoder to repeat the foregoing process. A bit in an output bit sequence is defined as $w_k$, and bits in the output bit sequence may be represented as $$w_{3k}=d_k^{(0)},\ w_{3k+1}=d_k^{(1)},\text{ and }w_{3k+2}=d_k^{(2)},$$

where k=0, 1, . . . , (k−1). This manner of "coding while sending" effectively simplifies buffer/storage overheads of the terminal device. However, this coding scheme is a "non-convergence" coding scheme because an end state of a register is inconsistent with an initial state of the register. A code distance between codewords finally encoded in this scheme is less than a code distance between codewords encoded in a scheme in which an end state of a register is consistent with an initial state of the register. Therefore, performance of convolutional coding is greatly reduced.

Therefore, this application proposes a channel coding method, to ensure performance of convolutional coding when reducing power consumption and complexity of convolutional coding in a terminal device.

The following describes the technical solution of this application in detail by using interaction between a terminal device and a network device as an example. The terminal device may be the terminal device (for example, the terminal device 102, the terminal device 103, or the terminal device 104) in FIG. 1, and the network device may be the network device 101 in FIG. 1.

Figure 4:
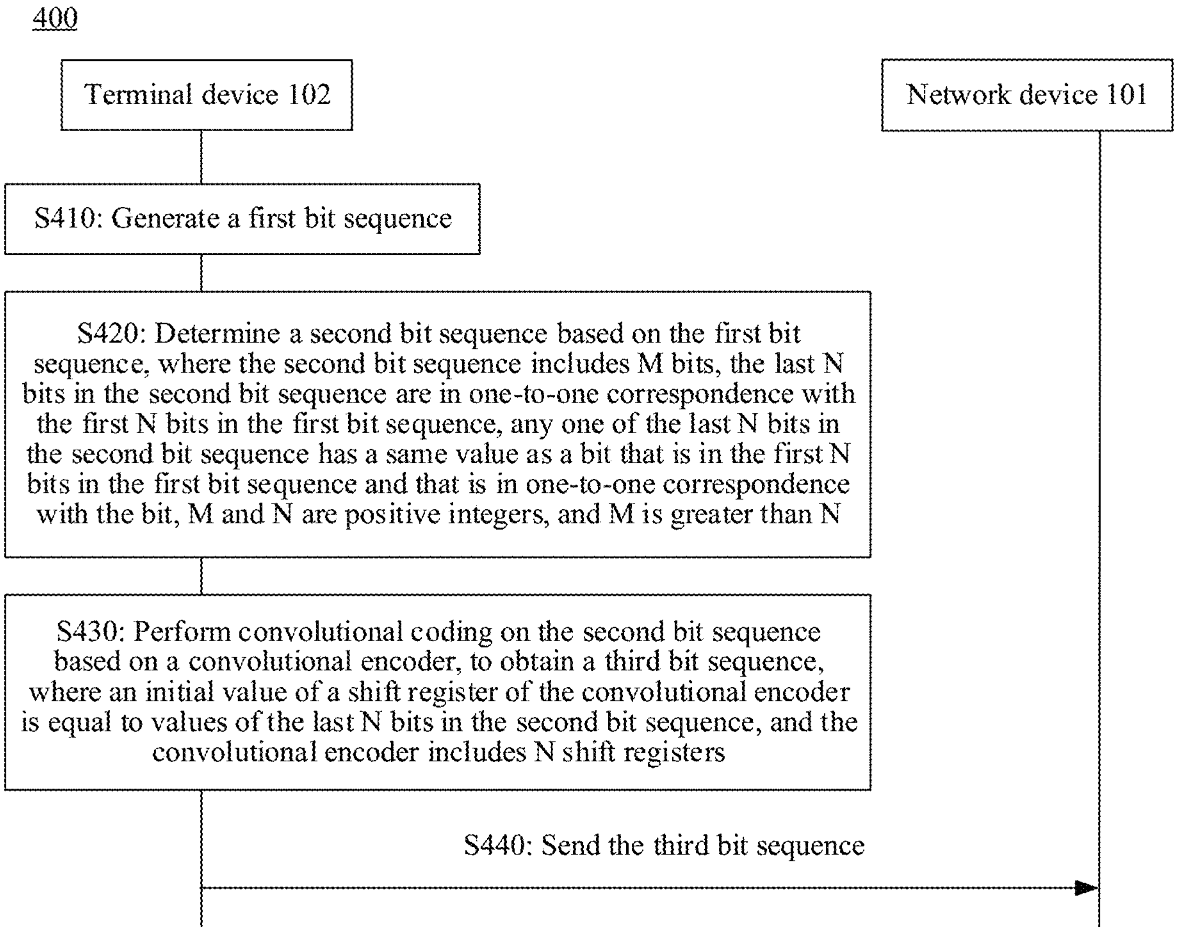
FIG. 4 is a schematic flowchart of an example of a channel coding method according to this application.

FIG. 4 is a schematic flowchart of an example of a channel coding method according to this application.

S410: A terminal device generates a first bit sequence.

The first bit sequence includes M bits. By way of example but not limitation, the first bit sequence may be $c_0$, $c_1$, $c_2$, . . . , $c_{M-1}$. The last L bits of the M bits in the first bit sequence are CRC bits, and L=8, 16, or 24. That is, $c_0$, $c_1$, $c_2$, . . . , $c_{M-L}$ is a bit sequence before the CRC bits are added, and the L CRC bits are $c_{M-L+1}$, $c_{M-L+2}$, $c_{M-L+3}$, . . . , $c_{M-1}$.

In this embodiment of this application, the bit sequence may also be referred to as a bit stream. For ease of description, the bit sequence is uniformly used in this application.

S420: The terminal device determines a second bit sequence based on the first bit sequence, where the second bit sequence includes M bits, the last N bits in the second bit sequence are in one-to-one correspondence with the first N bits in the first bit sequence, any bit in the last N bits in the second bit sequence has a same value as a bit that is in the first N bits in the first bit sequence and that is in one-to-one correspondence with the bit, M and N are positive integers, and M is greater than N.

In a possible implementation, the last N bits in the second bit sequence are in one-to-one correspondence with N consecutive bits starting from a predefined position in the first (M−L−N) bits in the first bit sequence, and any bit in the last N bits in the second bit sequence has a same value as the N consecutive bits starting from the predefined position in the first (M−L−N) bits in the first bit sequence. M and N are positive integers, and M is greater than (L+N).

Optionally, N is equal to 6 or another value. This is not limited in this application.

Optionally, the first M−N bits in the second bit sequence are the $(N+1)^{th}$ to the $M^{th}$ bits in the first bit sequence.

For example, when N is equal to 6, the second bit sequence may be $c_6$, $c_7$, $c_8$, . . . , $c_{M-1}$, $c_0$, $c_1$, $c_2$, $c_3$, $c_4$, $c_5$; or the second bit sequence may be $c_6$, $c_7$, $c_8$, . . . , $c_{M-1}$, $c_5$, $c_4$, $c_3$, $c_2$, $c_1$, $c_0$; or the second bit sequence may be $c_6$, $c_7$, $c_8$, . . . , $c_{M-1}$, $c_5$, $c_3$, $c_1$, $c_2$, $c_4$, $c_0$.

In this way, a bit sequence other than the first N bits in an original bit sequence is not disturbed, and complexity of convolutional coding performed by a low-power terminal device is not additionally increased.

In a possible implementation, the last N bits in the second bit sequence are in one-to-one correspondence with the N consecutive bits starting from the predefined position in the first (M−L−N) bits in the first bit sequence. The predefined position is j, j is an integer greater than or equal to 0 and less than or equal to (M−L−N), and the second bit sequence may be $c_6$, $c_7$, $c_8$, . . . , $c_{j-1}$, $c_{j+6}$, . . . , $c_{M-1}$, $c_{j+5}$, $c_{j+4}$, $c_{j+3}$, $c_{j+2}$, $c_{j+1}$, $c_j$.

S430: The terminal device performs convolutional coding on the second bit sequence based on a convolutional encoder, to obtain a third bit sequence, where an initial value of a shift register of the convolutional encoder is equal to values of the last N bits in the second bit sequence, and the convolutional encoder includes N shift registers.

Specifically, the initial value of the shift register of the convolutional encoder includes values of the N shift registers. A value of the $i^{th}$ shift register is $s_i$, i is a natural number less than N, the values of the last N bits in the second bit sequence are $x_{M-N+i}$, and values of the first N bits in the first bit sequence are $c_i$. $s_i$ is equal to $c_i$, and $x_{M-N+i}$ is equal to $c_{N-1-i}$; or $s_i$ is equal to $c_{N-1-i}$, and $x_{M-N+i}$ is equal to $c_i$.

Optionally, the initial value of the shift register of the convolutional encoder includes the values of the N shift registers, a value of the $i^{th}$ shift register is $s_i$, i is a natural number less than N, the values of the last N bits in the second bit sequence are $x_{M+N-i}$, and values of the N consecutive bits starting from the predefined position in the first (M−L−N) bits in the first bit sequence are $c_{j+i}$. $s_i$ is equal to $c_{j+i}$ and $x_{M+N-i}$ is equal to $c_{j+N-1-i}$; or $s_i$ is equal to $c_{N-1-i}$ and $x_{M+N-i}$ is equal to $c_{j+i}$.

The initial value of the shift register of the convolutional encoder may also be referred to as an initial state of the shift register of the convolutional encoder.

Figure 5:
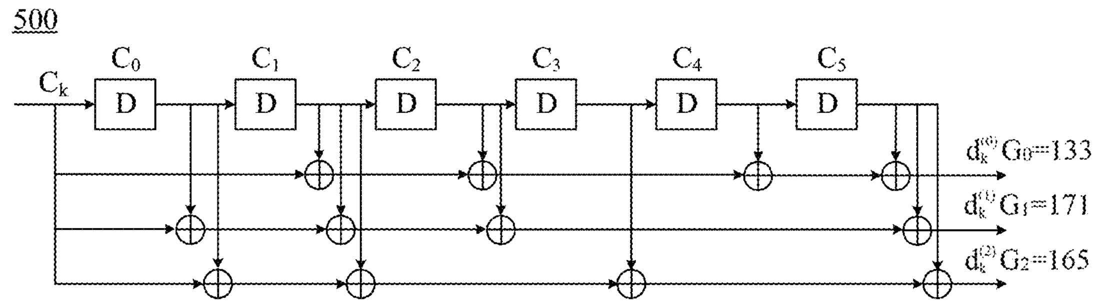
FIG. 5 is a first schematic of initial values of shift registers of a convolutional encoder according to an embodiment of this application.

For example, as shown in FIG. 5, when N is equal to 6, the initial values of the shift registers of the convolutional encoder may be set to $c_0$, $c_1$, $c_2$, $c_3$, $c_4$, and $c_5$, and the second bit sequence may be $c_6$, $c_7$, $c_8$, . . . , $c_{M-1}$, $c_0$, $c_1$, $c_2$, $c_3$, $c_4$, $c_5$. That is, 6 bits in the starting position of the first bit sequence are moved to the tail, and are arranged in ascending order of sequence numbers, to obtain the second bit sequence.

Figure 6:
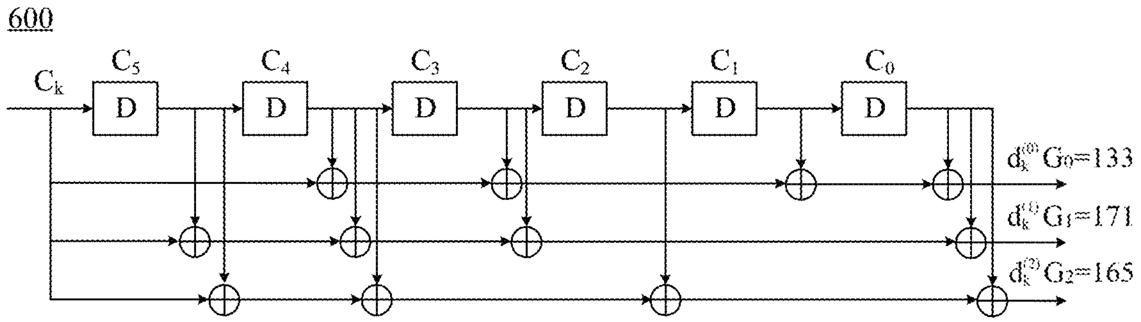
FIG. 6 is a second schematic of initial values of shift registers of a convolutional encoder according to an embodiment of this application.

For example, as shown in FIG. 6, when N is equal to 6, the initial values of the shift registers of the convolutional encoder may be set to $c_5$, $c_4$, $c_3$, $c_2$, $c_1$, and $c_0$, and the second bit sequence may be $c_6$, $c_7$, $c_8$, . . . , $c_{M-1}$, $c_5$, $c_4$, $c_3$, $c_2$, $c_1$, $c_0$. That is, 6 bits in the starting position of the first bit sequence are moved to the tail, and are arranged in descending order of sequence numbers, to obtain the second bit sequence.

Figure 7:
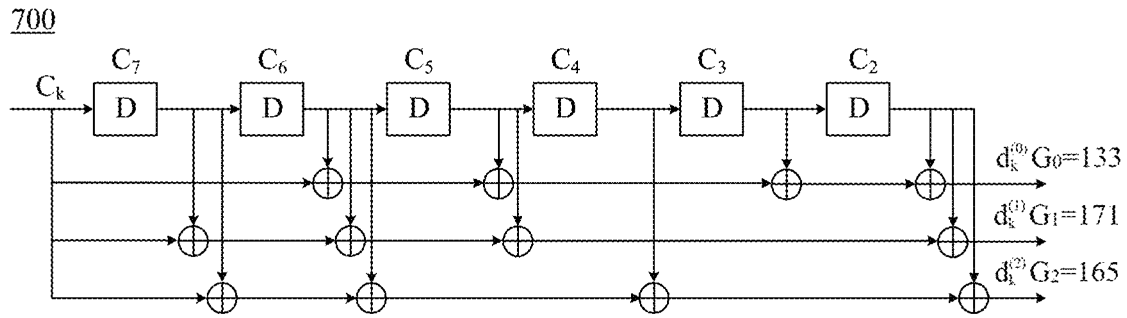
FIG. 7 is a third schematic of initial values of shift registers of a convolutional encoder according to an embodiment of this application.

For example, as shown in FIG. 7, when N is equal to 6, and j is equal to 2, the initial values of the shift registers of the convolutional encoder may be set to $c_7$, $c_6$, $c_5$, $c_4$, $c_3$, and $c_2$, and the second bit sequence may be $c_0$, $c_1$, . . . , $c_8$, $c_9$, $c_{10}$, . . . , $c_{M-1}$, $c_2$, $c_3$, $c_4$, $c_5$, $c_6$, $c_7$. That is, 6 bits in the starting position starting from the third bit $c_2$ in the first bit sequence are moved to the tail, and are arranged in ascending order of sequence numbers, to obtain the second bit sequence.

Figure 8:
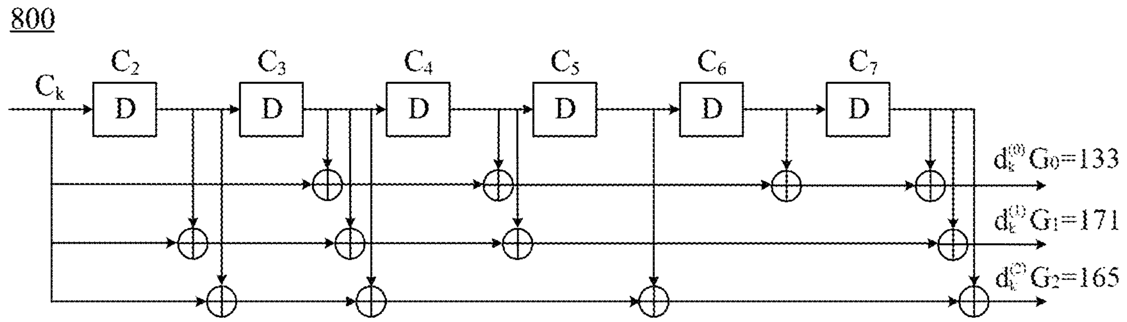
FIG. 8 is a fourth schematic of initial values of shift registers of a convolutional encoder according to an embodiment of this application.

For example, as shown in FIG. 8, when N is equal to 6, and j is equal to 2, the initial values of the shift registers of the convolutional encoder may be set to $c_2$, $c_3$, $c_4$, $c_5$, $c_6$, and $c_7$, and the second bit sequence may be $c_0$, $c_1$, . . . , $c_8$, $c_9$, $c_{10}$, . . . , $c_{M-1}$, $c_7$, $c_6$, $c_5$, $c_4$, $c_3$, $c_2$. That is, 6 bits in the starting position starting from the third bit $c_2$ in the first bit sequence are moved to the tail, and are arranged in descending order of sequence numbers, to obtain the second bit sequence.

It should be understood that the examples shown in FIG. 5 to FIG. 8 cannot represent all possible cases in this embodiment of this application. Based on the technical solution disclosed in this application, a person skilled in the art may set the initial values of the shift registers of the convolutional encoder to N (for example, 6) bits in the starting position of the first bit sequence. The N (for example, 6) bits may be arranged in any order, provided that the N (for example, 6) bits in the starting position of the first bit sequence are moved to the tail and are arranged in the same order, to obtain the second bit sequence.

Optionally, based on the technical solution disclosed in this application, a person skilled in the art may set the initial values of the shift registers of the convolutional encoder to N (for example, 6) consecutive bits starting from a predefined position in the first (M−L−N) bits. The N (for example, 6) bits may be arranged in any order, provided that the N (for example, 6) bits starting from the predefined position of the first bit sequence are moved to the tail, and the initial values of the shift registers are correspondingly equal to values of the N bits.

In this way, the first N bits in the first bit sequence are moved to the tail of the second bit sequence for sending, and are arranged in ascending or descending order of sequence numbers. Convolutional coding has a feature that an end state of a register is consistent with an initial state of the register, to ensure performance of convolutional coding performed by the low-power terminal device, and effectively improve coverage performance of communication between the low-power terminal device and the network device.

S440: The terminal device sends the third bit sequence.

In a possible implementation, before sending the third bit sequence, the terminal device skips performing first processing on the third bit sequence, and sends the third bit sequence. The first processing includes block interleaving and rate matching, and the rate matching includes at least one of bit collection, bit selection, and bit pruning. In this way, the third bit sequence is sent without any processing, so that buffer/storage overheads used for convolutional coding in the low-power terminal device are effectively reduced, and power consumption used for convolutional coding in the low-power terminal device is not additionally increased.

In another possible implementation, before sending the third bit, the terminal device performs second processing on the third bit sequence, to obtain a processed third bit sequence. The second processing includes block interleaving using a matrix in which a quantity of rows multiplied by a quantity of columns is less than a length of the third bit sequence. The quantity of columns of the matrix for block interleaving is less than 32. A value of the quantity of columns of the matrix for block interleaving is 4, 8, or 16. The block interleaving herein may also be referred to as sub-block interleaving. A quantity of rows for block interleaving multiplied by a quantity of columns is equal to a length of a sub-bit sequence. The third bit sequence includes P sub-bit sequences. P is greater than or equal to 1. For example, the length of the third bit sequence is 128, the third bit sequence may be divided into P=4 sub-bit sequences, and a length of each sub-bit sequence is 32. In this case, a matrix for block interleaving may be set to a matrix in which a quantity of rows multiplied by a quantity of columns is equal to the length of the sub-bit sequence. For example, the quantity of rows may be set to 4, and the quantity of columns may be set to 8. The terminal performs interleaving on each sub-bit sequence in this block interleaving manner and then performs bit collection, to obtain the processed third bit sequence. The terminal device sends the processed third bit sequence. In this way, the third bit sequence is processed to some extent before being sent, so that buffer/storage overheads used for convolutional coding in the low-power terminal device are slightly increased, to help improve performance of convolutional coding and effectively improve coverage performance of communication between the low-power terminal device and the network device.

Optionally, the terminal device may further send first information to the network device. The first information indicates that the terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder. Specifically, in this embodiment of this application, terminal devices may be classified based on capabilities of the terminal devices, for example, the terminal device with the first capability or a terminal device with a second capability. The terminal device with the first capability has a low capability and a low power consumption and storage level, and has a capability of performing coding according to the channel coding method in this application, but does not have a capability of performing coding through M-bit block interleaving and rate matching or the convolutional encoder. The terminal device with the second capability has a strong capability and a high power consumption and storage level, and not only has a capability of performing coding according to the channel coding method in this application, but also has a capability of performing coding through M-bit block interleaving and rate matching or the convolutional encoder. Optionally, the terminal device with the second capability further has a capability of performing coding through Reed-Muller (Reed Muller, RM) coding, cyclic redundancy check CRC coding, repetition coding, polar coding, and the like.

In this way, the network device can obtain a channel coding capability associated with a type of the terminal device, and correspondingly decode, for different channel coding schemes of different types of terminal devices, information bits sent by the terminal devices, so that both terminal devices with different capabilities and the network device can effectively complete channel coding sending and receiving, to effectively improve coverage performance of communication between the different terminal devices and the network device.

According to the technical solution of this application, the convolutional encoder is enabled for coding without obtaining the complete first bit sequence after CRC bits are added to original information bits. This effectively reduces buffer/storage overheads used for convolutional coding in the low-power terminal device, and helps further reduce power consumption used for convolutional coding in the low-power terminal device. In addition, convolutional coding has a feature that an end state of a register is consistent with an initial state of the register, to ensure performance of convolutional coding performed by the low-power terminal device, and effectively improve coverage performance of communication between the low-power terminal device and the network device.

Figure 9:
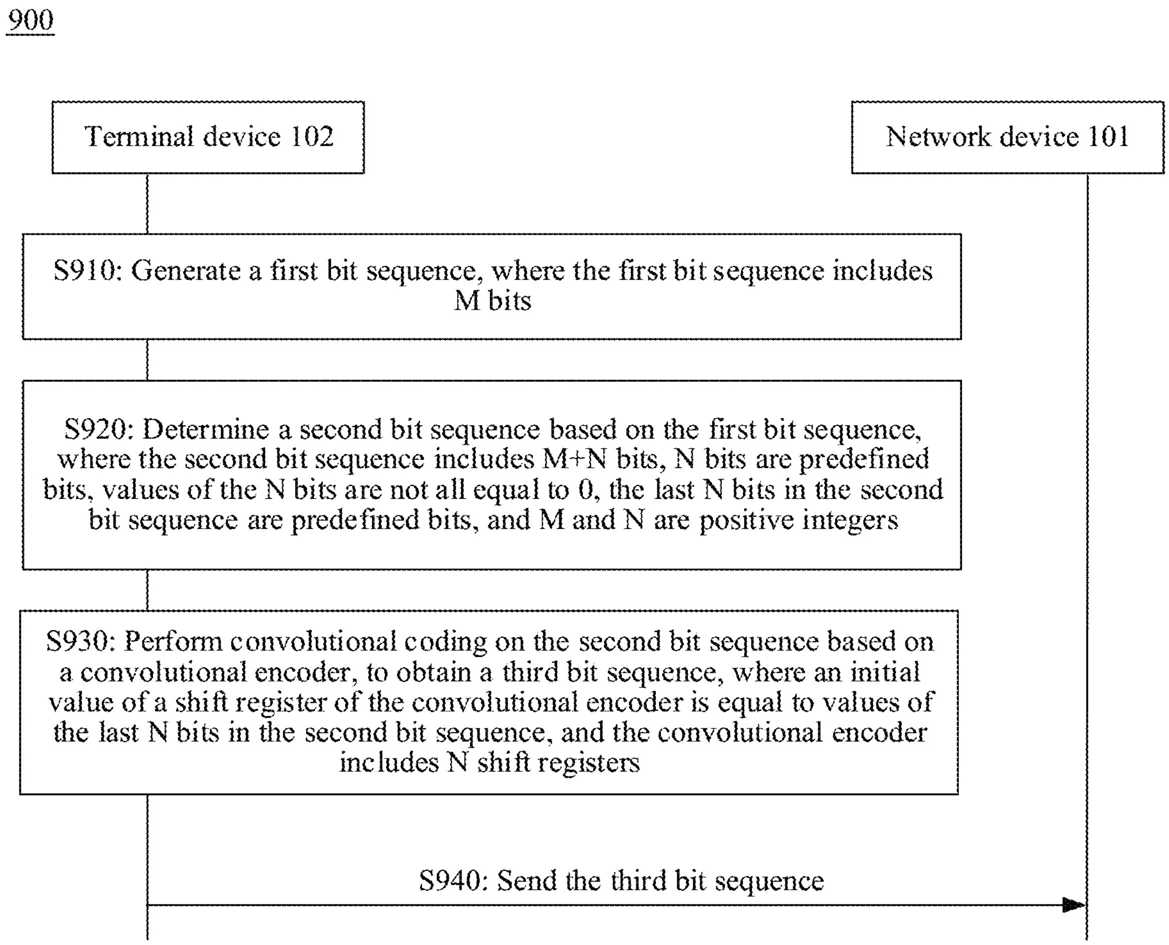
FIG. 9 is a schematic flowchart of another example of a channel coding method according to this application.

FIG. 9 is a schematic flowchart of another example of a channel coding method according to this application.

S910: A terminal device generates a first bit sequence, where the first bit sequence includes M bits.

For example, the first bit sequence may be $c_0$, $c_1$, $c_2$, . . . , $c_{M-1}$. The last L bits of the M bits in the first bit sequence are CRC bits, and L=8, 16, or 24. That is, $c_0$, $c_1$, $c_2$, . . . , $c_{M-L}$ is a bit sequence before the CRC bits are added, and the L CRC bits are $c_{M-L+1}$, $c_{M-L+2}$, $c_{M-L+3}$, . . . , $c_{M-1}$.

S920: The terminal device determines a second bit sequence based on the first bit sequence, where the second bit sequence includes M+N bits, N bits are predefined bits, values of the N bits are not all equal to 0, the last N bits in the second bit sequence are predefined bits, and M and N are positive integers.

The predefined N bits carry second information, and the second information includes information about a payload type, information about a service type, or information about a channel type. In this way, information may be carried on the predefined bits, to avoid a bit rate loss caused by additional N bits in convolutional coding during actual information transmission.

Optionally, the first M bits in the second bit sequence are M bits in the first bit sequence. In this way, a bit sequence in the original bit sequence is not disturbed. This helps reduce coding complexity of the terminal device when ensuring accuracy of information transmission.

Optionally, N is equal to 6.

For example, the second bit sequence may be $c_0$, $c_1$, $c_2$, . . . , $c_{M-1}$, $c_M$, $c_{M+1}$, . . . , $c_{M+N-1}$. When N is equal to 6, the second bit sequence may be $c_0$, $c_1$, $c_2$, . . . , $c_{M-1}$, $c_M$, $c_{M+1}$, . . . , $c_{M+5}$.

S930: The terminal device performs convolutional coding on the second bit sequence based on a convolutional encoder, to obtain a third bit sequence, where an initial value of a shift register of the convolutional encoder is equal to values of the last N bits in the second bit sequence, and the convolutional encoder includes N shift registers.

Specifically, as shown in FIG. 8, the initial value of the shift register of the convolutional encoder includes values of the N shift registers, a value of the $i^{th}$ shift register is $s_i$, i is a natural number less than N, the initial value of the shift register of the convolutional encoder may be $s_i=c_{M+N-i}$, and the values of the last N bits in the second bit sequence are $x_{M+N-i}$. $s_i$ is equal to $c_{N-1-i}$ and $x_{M+N-i}$ is equal to $c_i$.

For example, when N is equal to 6, the initial values of the shift registers of the convolutional encoder may be $c_M$, $c_{M+1}$, . . . , $c_{M+5}$, and the second bit sequence may be $c_0$, $c_1$, $c_2$, . . . , $c_{M-1}$, $c_M$, $c_{M+1}$, . . . , $c_{M+5}$.

S940: The terminal device sends the third bit sequence.

In a possible implementation, before sending the third bit sequence, the terminal device skips performing first processing on the third bit sequence, and sends the third bit sequence. The first processing includes block interleaving and rate matching, and the rate matching includes at least one of bit collection, bit selection, and bit pruning. In this way, the third bit sequence is sent without any processing, so that buffer/storage overheads used for convolutional coding in the low-power terminal device are effectively reduced, and power consumption used for convolutional coding in the low-power terminal device is not additionally increased.

In another possible implementation, before sending the third bit, the terminal device performs second processing on the third bit sequence, to obtain a processed third bit sequence. The second processing includes block interleaving using a matrix in which a quantity of rows multiplied by a quantity of columns is less than a length of the third bit sequence. The quantity of columns of the matrix for block interleaving is less than 32. A value of the quantity of columns of the matrix for block interleaving is 4, 8, or 16. The block interleaving herein may also be referred to as sub-block interleaving. A quantity of rows for block interleaving multiplied by a quantity of columns is equal to a length of a sub-bit sequence. The third bit sequence includes P sub-bit sequences. P is greater than or equal to 1. For example, the length of the third bit sequence is 128, the third bit sequence may be divided into P=4 sub-bit sequences, and a length of each sub-bit sequence is 32. In this case, a matrix for block interleaving may be set to a matrix in which a quantity of rows multiplied by a quantity of columns is equal to the length of the sub-bit sequence. For example, the quantity of rows may be set to 4, and the quantity of columns may be set to 8. The terminal performs interleaving on each sub-bit sequence in this block interleaving manner and then performs bit collection, to obtain the processed third bit sequence. The terminal device sends the processed third bit sequence. In this way, the third bit sequence is processed to some extent before being sent, so that buffer/storage overheads used for convolutional coding in the low-power terminal device are slightly increased, to help improve performance of convolutional coding and effectively improve coverage performance of communication between the low-power terminal device and the network device.

Optionally, the terminal device may further send first information to the network device. The first information indicates that the terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder.

Specifically, in this embodiment of this application, terminal devices may be classified based on capabilities of the terminal devices, for example, the terminal device with the first capability or a terminal device with a second capability. The terminal device with the first capability has a low capability and a low power consumption and storage level, and has a capability of performing coding according to the channel coding method in this application, but does not have a capability of performing coding through M-bit block interleaving and rate matching or the convolutional encoder. The terminal device with the second capability has a strong capability and a high power consumption and storage level, and not only has a capability of performing coding according to the channel coding method in this application, but also has a capability of performing coding through M-bit block interleaving and rate matching or the convolutional encoder. Optionally, the terminal device with the second capability further has a capability of performing coding through Reed-Muller RM coding, repetition coding, polar coding, and the like. In this way, the network device can obtain the type of the terminal device, and decode, based on the type of the terminal device, the information bit sent by the terminal device, to reduce decoding complexity of the network device.

According to the technical solution of this application, the convolutional encoder is enabled for coding without obtaining the complete first bit sequence after CRC bits are added to original information bits. This effectively reduces buffer/storage overheads used for convolutional coding in a low-power terminal device, and helps further reduce power consumption used for convolutional coding in the low-power terminal device. In addition, convolutional coding has a feature that an end state of a register is consistent with an initial state of the register, to ensure performance of convolutional coding performed by the low-power terminal device, and effectively improve coverage performance of communication between the low-power terminal device and the network device.

It should be understood that sequence numbers of the foregoing processes do not mean execution sequences. The execution sequence of the processes should be determined based on functions and internal logic of the processes, and should not be construed as any limitation on implementation processes of embodiments of this application.

It should be further understood that, in embodiments of this application, unless otherwise stated or there is a logic conflict, terms and/or descriptions in different embodiments are consistent and may be mutually referenced, and technical features in different embodiments may be combined based on an internal logical relationship thereof, to form a new embodiment.

It may be understood that, in the foregoing embodiments of this application, a method implemented by a communication device may be alternatively implemented by a component (for example, a chip or a circuit) that can be disposed inside the communication device.

Figure 11:
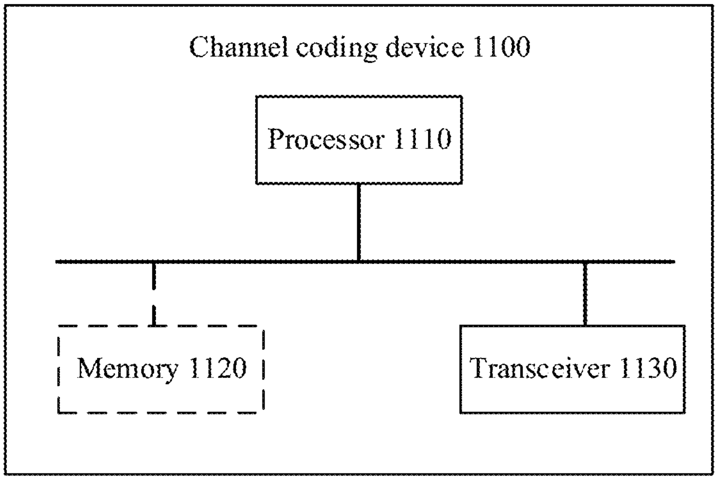
FIG. 11 is a diagram of an example of a channel coding device according to this application.
Figure 12:
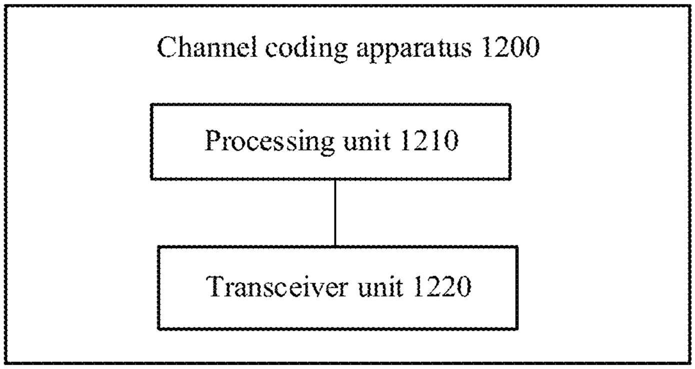
FIG. 12 is a diagram of an example of a channel coding apparatus according to this application.

The following describes in detail a channel coding apparatus provided in an embodiment of this application with reference to FIG. 11 and FIG. 12. It should be understood that descriptions of apparatus embodiments correspond to the descriptions of the method embodiments. Therefore, for content that is not described in detail, refer to the foregoing method embodiments. For brevity, some content is not described again.

In embodiments of this application, functional modules of the transmitting end device or the receiving end device may be obtained through division based on the foregoing method examples. For example, each functional module may be obtained through division based on each function, or two or more functions may be integrated into one processing module. The integrated module may be implemented in a form of hardware, or may be implemented in a form of a software functional module. It should be noted that, in embodiments of this application, module division is an example, and is merely a logical function division. During actual implementation, another division manner may be used. Descriptions are provided below by using an example in which each functional module is obtained through division based on each corresponding function.

The following describes in detail a channel coding apparatus provided in an embodiment of this application with reference to FIG. 11 and FIG. 12. It should be understood that descriptions of apparatus embodiments correspond to the descriptions of the method embodiments. Therefore, for content that is not described in detail, refer to the foregoing method embodiments. For brevity, some content is not described again.

In embodiments of this application, functional modules of a transmitting end device or a receiving end device may be obtained through division based on the foregoing method examples. For example, each functional module may be obtained through division based on each function, or two or more functions may be integrated into one processing module. The integrated module may be implemented in a form of hardware, or may be implemented in a form of a software functional module. It should be noted that, in embodiments of this application, module division is an example, and is merely a logical function division. During actual implementation, another division manner may be used. Descriptions are provided below by using an example in which each functional module is obtained through division based on each corresponding function.

FIG. 11 is a block diagram of an example of a channel coding device 1100 according to this application. Any device, such as a terminal device and a network device, in either of the method 400 and the method 900 may be implemented by the channel coding device shown in FIG. 11.

It should be understood that the channel coding device 1100 may be a physical device, a component (for example, an integrated circuit or a chip) of the physical device, or a functional module in the physical device.

As shown in FIG. 11, the channel coding device 1100 includes one or more processors 1110. Optionally, the processor 1110 may invoke an interface to implement receiving and sending functions. The interface may be a logical interface or a physical interface. This is not limited. For example, the interface may be a transceiver circuit, an input/output interface, or an interface circuit. The transceiver circuit, the input/output interface, or the interface circuit that is configured to implement the receiving and sending functions may be separated, or may be integrated together. The transceiver circuit or the interface circuit may be configured to read and write code/data, or the transceiver circuit or the interface circuit may be configured to transmit or transfer a signal.

Optionally, the interface may be implemented through a transceiver. Optionally, the channel coding device 1100 may further include a transceiver 1130. The transceiver 1130 may also be referred to as a transceiver unit, a transceiver machine, a transceiver circuit, or the like, and is configured to implement a transceiver function.

Optionally, the channel coding device 1100 may further include a memory 1120. A specific deployment position of the memory 1120 is not specifically limited in this embodiment of this application. The memory may be integrated into the processor, or may be independent of the processor. If the channel coding device 1100 does not include a memory, the channel coding device 1100 may have a processing function, and the memory may be deployed at another position (for example, a cloud system).

The processor 1110, the memory 1120, and the transceiver 1130 communicate with each other through an internal connection path, to transfer a control signal and/or a data signal.

It may be understood that although not shown, the channel coding device 1100 may further include another apparatus, for example, an input apparatus, an output apparatus, or a battery.

Optionally, in some embodiments, the memory 1120 may store execution instructions used to perform the method in embodiments of this application. The processor 1110 may execute the instructions stored in the memory 1120 and complete, in combination with other hardware (for example, the transceiver 1130), the steps performed in the following methods. For a specific working process and beneficial effects, refer to the descriptions in the foregoing method embodiments.

The methods disclosed in embodiments of this application may be applied to the processor 1110, or may be implemented by the processor 1110. The processor 1110 may be an integrated circuit chip and has a signal processing capability. In an implementation process, the steps of the method may be performed through a hardware integrated logic circuit in the processor or by using instructions in a form of software. The foregoing processor may be a general-purpose processor, a digital signal processor (DSP), an application-specific integrated circuit (ASIC), a field programmable gate array (FPGA) or another programmable logic device, a discrete gate or transistor logic device, or a discrete hardware component. It may implement or perform the methods, the steps, and logical block diagrams that are disclosed in embodiments of this application. The general-purpose processor may be a microprocessor, or the processor may be any conventional processor or the like. The steps of the methods disclosed with reference to embodiments of this application may be performed by a hardware decoding processor, or may be performed by using a combination of hardware in the decoding processor and a software module. The software module may be located in a mature storage medium in the art, such as a random access memory (RAM), a flash memory, a read-only memory (ROM), a programmable read-only memory, an electrically erasable programmable memory, or a register. The storage medium is located in the memory, and a processor reads instructions in the memory and completes the steps in the foregoing methods in combination with hardware of the processor.

It may be understood that the memory 1120 may be a volatile memory or a non-volatile memory, or may include both a volatile memory and a non-volatile memory. The non-volatile memory may be a read-only memory ROM, a programmable read-only memory (PROM), an erasable programmable read-only memory (erasable PROM, EPROM), an electrically erasable programmable read-only memory (electrically EPROM, EEPROM), or a flash memory. The volatile memory may be a random access memory RAM, and may serve as an external cache. Through example but not limitative description, many forms of RAMs may be used, for example, a static random access memory (static RAM, SRAM), a dynamic random access memory (dynamic RAM, DRAM), a synchronous dynamic random access memory (synchronous DRAM, SDRAM), a double data rate synchronous dynamic random access memory (double data rate SDRAM, DDR SDRAM), an enhanced synchronous dynamic random access memory (enhanced SDRAM, ESDRAM), a synchronous link dynamic random access memory (synchlink DRAM, SLDRAM), and a direct rambus dynamic random access memory (direct rambus RAM, DR RAM). It should be noted that the memory of the systems and methods described in this specification includes but is not limited to these and any memory of another proper type.

FIG. 12 is a block diagram of an example of a channel coding apparatus 1200 according to this application.

Optionally, a specific form of the channel coding apparatus 1200 may be a general-purpose computer device or a chip in the general-purpose computer device. This is not limited in this embodiment of this application. As shown in FIG. 12, the channel coding apparatus includes a processing unit 1210 and a transceiver unit 1220.

Specifically, the channel coding apparatus 1200 may be any device in this application, and may implement a function that can be implemented by the device. It should be understood that the channel coding apparatus 1200 may be a physical device, a component (for example, an integrated circuit or a chip) of the physical device, or a functional module in the physical device.

In a possible design, the channel coding apparatus 1200 may be the terminal device in the foregoing method embodiments, or may be a chip configured to implement a function of the terminal device in the foregoing method embodiments.

In an example, the communication apparatus is configured to perform the actions performed by the terminal device in FIG. 4 or FIG. 7.

When performing the actions performed by the terminal device in FIG. 4, the processing unit 1210 is configured to perform S410, S420, and S430, and the transceiver unit 1220 is configured to perform S440.

For example, the processing unit 1210 is configured to: generate a first bit sequence; determine a second bit sequence based on the first bit sequence, where the second bit sequence includes M bits, the last N bits in the second bit sequence are in one-to-one correspondence with first N bits in the first bit sequence, and any bit in the last N bits in the second bit sequence has a same value as a bit that is in the first N bits in the first bit sequence and that is in one-to-one correspondence with the bit, M and N are positive integers, and M is greater than N; and perform convolutional coding on the second bit sequence based on a convolutional encoder, to obtain a third bit sequence, where an initial value of a shift register of the convolutional encoder is equal to values of the last N bits in the second bit sequence, and the convolutional encoder includes N shift registers. The transceiver unit 1220 is configured to send the third bit sequence.

Optionally, the first M−N bits in the second bit sequence are the $(N+1)^{th}$ to the $M^{th}$ bits in the first bit sequence. Optionally, the initial value of the shift register of the convolutional encoder includes values of N shift registers. A value of the $i^{th}$ shift register is $s_i$, i is a natural number less than N, values of the last N bits in the second bit sequence are $x_{M-N+i}$, and values of the first N bits in the first bit sequence are $c_i$. $s_i$ is equal to $c_i$, and $x_{M-N+i}$ is equal to $c_{N-1-i}$; or $s_i$ is equal to $c_{N-1-i}$, and $x_{M-N+i}$ is equal to $c_i$.

Optionally, N is equal to 6.

Optionally, the processing unit 1210 is further configured to skip performing first processing on the third bit sequence, and the transceiver unit 1220 is further configured to send the third bit sequence. The first processing includes block interleaving and/or rate matching, and the rate matching includes at least one of bit collection, bit selection, and bit pruning.

Optionally, the processing unit 1210 is further configured to perform second processing on the third bit sequence, to obtain a processed third bit sequence. The second processing includes block interleaving using a matrix in which a quantity of rows multiplied by a quantity of columns is less than a length of the third bit sequence. The quantity of columns of the matrix for block interleaving is less than 32, and a value of the quantity of columns of the matrix for block interleaving is 4, 8, or 16. The transceiver unit 1220 is further configured to send the processed third bit sequence.

Optionally, the transceiver unit 1220 is further configured to send first information. The first information indicates that the terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder.

When performing the actions performed by the terminal device in FIG. 9, the processing unit 1210 is configured to perform S910, S920, and S930, and the transceiver unit 1220 is configured to perform S940.

For example, the processing unit 1210 is configured to: generate a first bit sequence, where the first bit sequence includes M bits; determine a second bit sequence based on the first bit sequence, where the second bit sequence includes M+N bits, N bits are predefined bits, values of the N bits are not all equal to 0, the last N bits in the second bit sequence are predefined bits, and M and N are positive integers; and perform convolutional coding on the second bit sequence based on a convolutional encoder, to obtain a third bit sequence, where an initial value of a shift register of the convolutional encoder is equal to values of the last N bits in the second bit sequence, and the convolutional encoder includes N shift registers. The transceiver unit 1220 is configured to send the third bit sequence.

Optionally, the first M bits in the second bit sequence are M bits in the first bit sequence.

Optionally, the predefined N bits carry second information, and the second information includes information about a payload type, information about a service type, or information about a channel type.

Optionally, N is equal to 6.

Optionally, the processing unit 1210 is further configured to skip performing first processing on the third bit sequence. The first processing includes block interleaving and/or rate matching, and the rate matching includes at least one of bit collection, bit selection, and bit pruning. The transceiver unit 1220 is configured to send the third bit sequence.

Optionally, the processing unit 1210 is further configured to perform second processing on the third bit sequence, to obtain a processed third bit sequence. The second processing includes block interleaving less than a length of the third bit sequence. The quantity of columns for block interleaving is less than 32, and a value of the quantity of columns for block interleaving is 4, 8, or 16. The transceiver unit is configured to send the processed third bit sequence.

Optionally, the transceiver unit 1220 is further configured to send first information. The first information indicates that the terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder.

It should be further understood that when the channel coding apparatus 1200 is the terminal device, the transceiver unit 1220 in the channel coding apparatus 1200 may be implemented by using a communication interface (for example, a transceiver or an input/output interface), and the processing unit 1210 in the channel coding apparatus 1200 may be implemented by using at least one processor, for example, may correspond to the processor 1110 shown in FIG. 11.

Optionally, the channel coding apparatus 1200 may further include a storage unit. The storage unit may be configured to store instructions or data. The processing unit may invoke the instructions or the data stored in the storage unit, to implement a corresponding operation.

It should be understood that a specific process in which the units perform the foregoing corresponding steps is described in detail in the foregoing method embodiments, and for brevity, details are not described herein.

In another possible design, the channel coding apparatus 1200 may be the network device in the foregoing method embodiments, or may be a chip configured to implement a function of the network device in the foregoing method embodiments.

In an example, the communication apparatus is configured to perform the actions performed by the network device in FIG. 4 or FIG. 9. For example, when the communication apparatus is configured to perform the actions performed by the network device in FIG. 4, the transceiver unit 1220 is configured to receive a third bit sequence. The processing unit 1210 is configured to decode the third bit sequence based on the last N bits in a second bit sequence, to obtain the second bit sequence, where the second bit sequence includes M bits, and the N bits are the last N bits in the second bit sequence. The network device determines a first bit sequence based on the second bit sequence. The first N bits in the first bit sequence are in one-to-one correspondence with the last N bits in the second bit sequence, any bit in the first N bits in the first bit sequence has a same value as a bit that is in the last N bits in the second bit sequence and that is in one-to-one correspondence with the bit, M and N are positive integers, and M is greater than N.

Optionally, the $(N+1)^{th}$ to the $M^{th}$ bits in the first bit sequence are first M−N bits in the second bit sequence.

Optionally, N is equal to 6.

Optionally, the processing unit 1210 is configured to: skip performing first processing on the third bit sequence, and obtain the last N bits in the second bit sequence based on the third bit sequence. The first processing includes block de-interleaving and/or rate de-matching, and rate matching includes at least one of bit collection, bit selection, and bit pruning.

Optionally, second processing is performed on the third bit sequence, to obtain a processed third bit sequence, where the second processing includes de-interleaving block interleaving less than a length (or M) of the third bit sequence, a quantity of columns for block interleaving is less than 32, and a value of the quantity of columns for block interleaving is 4, 8, or 16. The last N bits in the second bit sequence are determined based on the processed third bit sequence.

Optionally, the transceiver unit 1220 is further configured to receive first information. The first information indicates that the terminal device is a terminal device with a first capability, and the first capability includes at least one of the following: not performing block interleaving on the third bit sequence, or performing the block interleaving on the third bit sequence; not performing the rate matching on the third bit sequence; and performing convolutional coding on the first bit sequence based on the convolutional encoder.

For another example, when the communication apparatus is configured to perform the actions performed by the network device in FIG. 9, the transceiver unit 1220 is configured to receive a third bit sequence. The processing unit 1210 is configured to: determine the last N bits in the second bit sequence based on the third bit sequence; decode the third bit sequence based on the last N bits in the second bit sequence, to obtain a second bit sequence, where the second bit sequence includes M+N bits, N bits are predefined bits, values of the N bits are not all equal to 0, the last N bits in the second bit sequence are predefined bits, and M and N are positive integers; and determine a first bit sequence based on the second bit sequence, where the first bit sequence includes M bits.

Optionally, the first M bits in the second bit sequence are M bits in the first bit sequence.

Optionally, the predefined N bits carry second information, and the second information includes information about a payload type, information about a service type, or information about a channel type.

Optionally, N is equal to 6.

Optionally, the processing unit 1210 is configured to: skip performing first processing on the third bit sequence, and obtain the N bits based on the third bit sequence. The first processing includes block de-interleaving and/or rate de-matching, and rate matching includes at least one of bit collection, bit selection, and bit pruning.

Optionally, the processing unit 1210 is configured to: perform second processing on the third bit sequence, to obtain a processed third bit sequence, where the second processing includes de-interleaving block interleaving less than a length (or M) of the third bit sequence, a quantity of columns for block interleaving is less than 32, and a value of the quantity of columns for block interleaving is 4, 8, or 16; and determine the last N bits in the second bit sequence based on the processed third bit sequence.

Optionally, the transceiver unit 1220 is further configured to receive first information. The first information indicates that the terminal device is a terminal device with a first capability, and the first capability includes at least one of the following: not performing block interleaving on the third bit sequence, or performing the block interleaving on the third bit sequence; not performing the rate matching on the third bit sequence; and performing channel coding on the first bit sequence based on a channel encoder.

It should be further understood that when the channel coding apparatus 1200 is the network device, the transceiver unit 1220 in the channel coding apparatus 1200 may be implemented by using a communication interface (for example, a transceiver or an input/output interface), and the processing unit 1210 in the channel coding apparatus 1200 may be implemented by using at least one processor, for example, may correspond to the processor 1110 shown in FIG. 11.

Optionally, the channel coding apparatus 1200 may further include a storage unit. The storage unit may be configured to store instructions or data. The processing unit may invoke the instructions or the data stored in the storage unit, to implement a corresponding operation.

It should be understood that a specific process in which the units perform the foregoing corresponding steps is described in detail in the foregoing method embodiments, and for brevity, details are not described herein.

It should be further understood that when the channel coding apparatus 1200 is the network device, the transceiver unit 1220 in the channel coding apparatus 1200 may be implemented by using a communication interface (for example, a transceiver or an input/output interface), and the processing unit 1210 in the channel coding apparatus 1200 may be implemented by using at least one processor, for example, may correspond to the processor 1110 shown in FIG. 11.

Optionally, the channel coding apparatus 1200 may further include a storage unit. The storage unit may be configured to store instructions or data. The processing unit may invoke the instructions or the data stored in the storage unit, to implement a corresponding operation.

It should be understood that a specific process in which the units perform the foregoing corresponding steps is described in detail in the foregoing method embodiments, and for brevity, details are not described herein.

Figure 10:
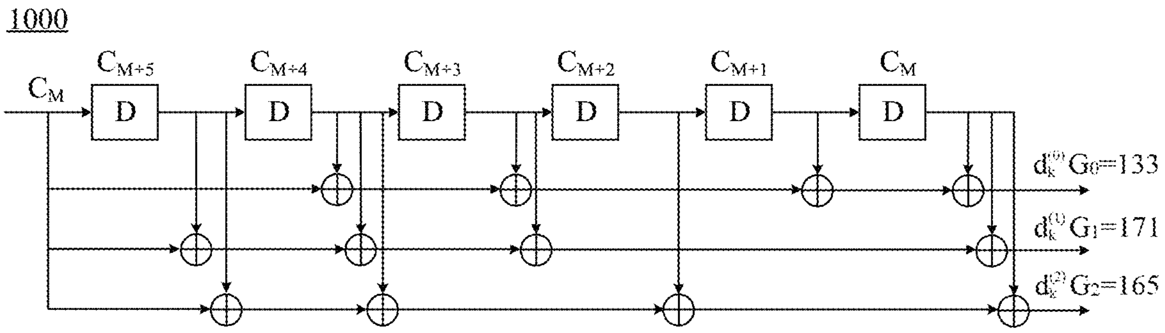
FIG. 10 is a fifth schematic of initial values of shift registers of a convolutional encoder according to an embodiment of this application.

In addition, in this application, the channel coding apparatus 1200 is presented in a form of a functional module. The "module" herein may be an application-specific integrated circuit ASIC, a circuit, a processor that executes one or more software or firmware programs and a memory, an integrated logic circuit, and/or another component that can provide the foregoing functions. In a simple embodiment, a person skilled in the art may figure out that the apparatus 1200 may be in a form shown in FIG. 10. The processing unit 1210 may be implemented by using the processor 1110 shown in FIG. 11. Optionally, if the computer device shown in FIG. 11 includes the memory 1120, the processing unit 1210 may be implemented by using the processor 1110 and the memory 1120. The transceiver unit 1220 may be implemented by using the transceiver 1130 shown in FIG. 11. The transceiver 1130 includes a receiving function and a sending function. Specifically, the processor is implemented by executing a computer program stored in the memory. Optionally, when the apparatus 1200 is a chip, a function and/or an implementation process of the transceiver unit 1220 may alternatively be implemented through a pin, a circuit, or the like. Optionally, the memory may be a storage unit in the chip, for example, a register or a cache. Alternatively, the storage unit may be a storage unit that is in the channel coding apparatus and that is located outside the chip, for example, the memory 1120 shown in FIG. 11, or may be a storage unit that is deployed in another system or device and is not in the computer device.

Various aspects or features of this application may be implemented as methods, apparatuses, or products using standard programming and/or engineering techniques. For example, the computer-readable medium may include but is not limited to: a magnetic storage component (for example, a hard disk, a floppy disk or a magnetic tape), an optical disc (for example, a compact disc (CD), a digital versatile disc (DVD)), a smart card and a flash memory component (for example, an erasable programmable read-only memory (EPROM), a card, a stick, or a key drive). In addition, various storage media described in this specification may represent one or more devices and/or other machine-readable media that are configured to store information. The term "machine-readable media" may include but is not limited to various other media that can store, contain and/or carry instructions and/or data.

According to the method provided in embodiments of this application, this application further provides a computer program product. The computer program product includes a computer program or a group of instructions. When the computer program or the group of instructions are run on a computer, the computer is enabled to perform the method in any one of the embodiments shown in FIG. 4 and FIG. 9.

According to the method provided in embodiments of this application, this application further provides a computer-readable storage medium. The computer-readable storage medium stores a program or a group of instructions. When the program or the group of instructions are run on a computer, the computer is enabled to perform the method in any one of the embodiments shown in FIG. 4 and FIG. 9.

According to the method provided in embodiments of this application, this application further provides a communication system. The communication system includes the foregoing apparatus or device.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, an execution thread, a program, and/or a computer. As illustrated by using figures, both a computing device and an application that runs on the computing device may be components. One or more components may reside within a process and/or a thread of execution, and a component may be located on one computer and/or distributed between two or more computers. In addition, these components may be executed from various computer-readable media that store various data structures. The components may communicate by using a local and/or remote process and according to, for example, a signal having one or more data packets (for example, data from two components interacting with another component in a local system, a distributed system, and/or across a network such as the Internet interacting with other systems by using the signal).

It should also be understood that the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be further understood that numbers "first", "second", and the like are introduced in embodiments of this application only to distinguish between different objects, for example, distinguish between different "information", "devices", or "units". Understanding of a specific object and a correspondence between different objects should be determined based on functions and internal logic of the specific object, and should not constitute any limitation on an implementation process of embodiments of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method, comprising:

generating, by a terminal device, a first bit sequence;

determining, by the terminal device, a second bit sequence based on the first bit sequence, wherein the second bit sequence comprises M bits, a last N bits in the second bit sequence are in one-to-one correspondence with a first N bits in the first bit sequence, each bit in the last N bits in the second bit sequence has a same value as a bit that is in the first N bits in the first bit sequence and that is in the one-to-one correspondence with the respective bit, M and N are positive integers, and M is greater than N;

performing, by the terminal device, convolutional coding on the second bit sequence based on a convolutional encoder, to obtain a third bit sequence, wherein an initial value of a first shift register of the convolutional encoder is equal to values of the last N bits in the second bit sequence, and the convolutional encoder comprises N shift registers; and sending, by the terminal device, the third bit sequence.

2. The method according to claim 1, wherein a first M-N bits in the second bit sequence are (N+1)th to Mth bits in the first bit sequence.

3. The method according to claim 1, wherein the initial value of the first shift register of the convolutional encoder is an initial value of each of the N shift registers, a value of an ith shift register is $s_i$, i is a natural number less than N, the values of the last N bits in the second bit sequence are $x_{(M-N+i)}$, and values of the first N bits in the first bit sequence are $c_i$; and $s_i$ is equal to $c_i$, and $x_{(M-N+i)}$ is equal to $c_{(N-1-i)}$; or $s_i$ is equal to $c_{(N-1-i)}$, and $x_{(M-N+i)}$ is equal to $c_i$.

4. The method according to claim 1, wherein N is equal to 6.

5. The method according to claim 1, wherein sending, by the terminal device, the third bit sequence comprises:

skipping, by the terminal device, performing first processing on the third bit sequence, and sending the third bit sequence, wherein the first processing comprises block interleaving or rate matching, and the rate matching comprises at least one of bit collection, bit selection, or bit pruning.

6. A method, comprising:

receiving, by a network device, a third bit sequence;

decoding, by the network device, the third bit sequence, to obtain a second bit sequence, wherein the second bit sequence comprises M bits; and determining, by the network device, a first bit sequence based on the second bit sequence, wherein a first N bits in the first bit sequence are in one-to-one correspondence with a last N bits in the second bit sequence, each bit in the first N bits in the first bit sequence has a same value as a bit that is in the last N bits in the second bit sequence and that is in the one-to-one correspondence with the respective bit, M and N are positive integers, and M is greater than N.

7. The method according to claim 6, wherein (N+1)th to Mth bits in the first bit sequence are first M−N bits in the second bit sequence.

8. The method according to claim 6, wherein N is equal to 6.

9. The method according to claim 6, wherein decoding, by the network device, the third bit sequence, to obtain the second bit sequence comprises:

skipping, by the network device, performing first processing on the third bit sequence, and obtaining the second bit sequence based on the third bit sequence, wherein the first processing comprises block de-interleaving or rate de-matching, and the rate matching comprises at least one of bit collection, bit selection, or bit pruning.

10. The method according to claim 6, wherein decoding, by the network device, the third bit sequence, to obtain the second bit sequence comprises:

performing, by the network device, second processing on the third bit sequence, to obtain a processed third bit sequence, wherein the second processing comprises de-interleaving block interleaving performed using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16; and determining, by the network device, the second bit sequence based on the processed third bit sequence.

11. A communication apparatus, comprising:

a memory, storing computer instructions; and at least one processor, configured to execute the computer instructions stored in the memory, to enable the communication apparatus to perform operations comprising:

generating a first bit sequence;

determining a second bit sequence based on the first bit sequence, wherein the second bit sequence comprises M bits, a last N bits in the second bit sequence are in one-to-one correspondence with a first N bits in the first bit sequence, each bit in the last N bits in the second bit sequence has a same value as a bit that is in the first N bits in the first bit sequence and that is in the one-to-one correspondence with the respective bit, M and N are positive integers, and M is greater than N;

performing convolutional coding on the second bit sequence based on a convolutional encoder, to obtain a third bit sequence, wherein an initial value of a first shift register of the convolutional encoder is equal to values of the last N bits in the second bit sequence, and the convolutional encoder comprises N shift registers; and sending the third bit sequence.

12. The communication apparatus according to claim 11, wherein a first M−N bits in the second bit sequence are (N+1)th to Mth bits in the first bit sequence.

13. The communication apparatus according to claim 11, wherein the initial value of the first shift register of the convolutional encoder is an initial value of each of the N shift registers, a value of an ith shift register is s_i, i is a natural number less than N, the values of the last N bits in the second bit sequence are x_(M−N+i), and values of the first N bits in the first bit sequence are c_i; and s_i is equal to c_i, and x_(M−N+i) is equal to c_(N−1−i); or s_i is equal to c_(N−1−i), and x_(M−N+i) is equal to c_i.

14. The communication apparatus according to claim 11, wherein N is equal to 6.

15. The communication apparatus according to claim 11, wherein the computer instructions enable the communication apparatus to perform operations further comprising:

skipping performing first processing on the third bit sequence, and sending the third bit sequence, wherein the first processing comprises block interleaving or rate matching, and the rate matching comprises at least one of bit collection, bit selection, or bit pruning.

16. A communication apparatus, comprising:

a memory, storing computer instructions; and at least one processor, configured to execute the computer instructions stored in the memory, to enable the communication apparatus to perform operations comprising:

receiving a third bit sequence;

decoding the third bit sequence, to obtain a second bit sequence, wherein the second bit sequence comprises M bits; and determining a first bit sequence based on the second bit sequence, wherein a first N bits in the first bit sequence are in a one-to-one correspondence with a last N bits in the second bit sequence, each bit in the first N bits in the first bit sequence has a same value as a bit that is in the last N bits in the second bit sequence and that is in the one-to-one correspondence with the respective bit, M and N are positive integers, and M is greater than N.

17. The communication apparatus according to claim 16, wherein an (N+1)th to Mth bits in the first bit sequence are first M−N bits in the second bit sequence.

18. The communication apparatus according to claim 16, wherein N is equal to 6.

19. The communication apparatus according to claim 16, wherein the computer instructions enable the communication apparatus to perform operations further comprising:

skipping performing first processing on the third bit sequence, and obtaining the second bit sequence based on the third bit sequence, wherein the first processing comprises block de-interleaving or rate de-matching, and the rate matching comprises at least one of bit collection, bit selection, or bit pruning.

20. The communication apparatus according to claim 16, wherein the computer instructions enable the communication apparatus to perform operations further comprising:

performing second processing on the third bit sequence, to obtain a processed third bit sequence, wherein the second processing comprises de-interleaving block interleaving performed using a matrix in which a quantity of rows multiplied by a quantity of columns is less than a length of the third bit sequence, the quantity of columns of the matrix for block interleaving is less than 32, and a value of the quantity of columns of the matrix for block interleaving is 4, 8, or 16; and determining the second bit sequence based on the processed third bit sequence.

* * * * *